United States Patent [19]

Lemson

[11] Patent Number: 5,321,849
[45] Date of Patent: Jun. 14, 1994

[54] SYSTEM FOR CONTROLLING SIGNAL LEVEL AT BOTH ENDS OF A TRANSMISSION LINK BASED ON A DETECTED VALVE

[75] Inventor: Paul H. Lemson, St. Louis, Mo.

[73] Assignee: Southwestern Bell Technology Resources, Inc., St. Louis, Mo.

[21] Appl. No.: 704,114

[22] Filed: May 22, 1991

[51] Int. Cl.$^5$ .............................................. H04B 1/16
[52] U.S. Cl. ................................ 455/67.1; 455/235.1; 455/249.1; 455/282; 455/289; 455/291; 359/194
[58] Field of Search ....................... 455/13.4, 14, 67.1, 455/67.5, 70, 72, 234.1, 234.2, 235.1, 249.1, 253.2, 254, 281, 282, 283, 289, 291, 295; 333/17.2; 359/194

[56] References Cited

U.S. PATENT DOCUMENTS

| | | |
|---|---|---|
| 3,444,469 | 5/1969 | Miyagi . |
| 3,456,191 | 7/1969 | Rodenburg et al. . |
| 3,619,786 | 11/1971 | Wilcox . |
| 3,912,946 | 10/1975 | Graziadei . |
| 4,004,224 | 1/1977 | Arens et al. ............................. 455/70 |
| 4,169,219 | 9/1979 | Beard ................................. 455/235.1 |
| 4,188,587 | 2/1980 | Palmer ................................. 330/136 |
| 4,270,222 | 5/1981 | Menant .............................. 455/236.1 |
| 4,355,304 | 10/1982 | Kasuga et al. ......................... 455/72 |
| 4,457,020 | 6/1984 | King ....................................... 455/70 |
| 4,476,573 | 10/1984 | Duckeck ................................. 455/45 |
| 4,482,973 | 11/1984 | Unagami et al. ...................... 364/602 |
| 4,531,234 | 7/1985 | Bell ..................................... 455/291 |
| 4,545,075 | 10/1985 | Miller et al. . |
| 4,553,105 | 11/1985 | Sasaki ................................... 455/249 |
| 4,654,891 | 3/1987 | Smith .................................... 455/617 |
| 4,658,296 | 4/1987 | Beech .................................... 358/167 |
| 4,665,560 | 5/1987 | Lange ................................. 455/249.1 |
| 4,722,081 | 1/1988 | Fujito et al. .......................... 355/194 |
| 4,754,495 | 6/1988 | Kawano et al. ....................... 455/17 |
| 4,769,853 | 9/1988 | Goodwin et al. . |
| 4,772,956 | 9/1988 | Roche et al. ......................... 358/260 |
| 4,811,423 | 3/1989 | Eastmond ........................... 455/203 |
| 4,849,711 | 7/1989 | Leis et al. .............................. 330/279 |
| 4,859,964 | 8/1989 | Jorgensen ............................. 330/279 |
| 4,893,300 | 1/1990 | Carlin et al. ............................. 370/3 |
| 4,910,791 | 3/1990 | Dickinson et al. .................... 455/4.1 |
| 4,947,459 | 8/1990 | Nelson et al. ........................ 455/612 |
| 5,067,147 | 11/1991 | Lee ........................................ 379/60 |

FOREIGN PATENT DOCUMENTS

| | | | |
|---|---|---|---|
| 0039641 | 4/1981 | Japan ................................... 359/194 |
| 0035844 | 2/1985 | Japan ................................... 359/194 |

OTHER PUBLICATIONS

Koscinski, J., "Transmission of Analog FDM Signals on Fiber Optics Link", RF Design, Apr. 1987, pp. 34–41.

Ramadan, M., "Analog Signals Transmission over Optical Fiber Systems," 1985 IEEE MTT-s Digest, Jun. 1985, pp. 303–306.

Ehrlich, N. et al., "Cell-Site Hadrware," *The Bell System Technical Journal*, Jan. 1979, pp. 153–199.

Fye, Donald M., "Design of Fiber Optic Antenna Remoting Links for Cellular Radio Applications," *Proceedings of VTC '90*, May 1990, pp. 622–625.

Meyer, Louis J., "Using Fiber Optics with Analog R. F. Signals, " *Proceedings of VIC '89*, May 1989, pp. 398–400.

(List continued on next page.)

Primary Examiner—Reinhard J. Eisenzopf
Assistant Examiner—Chi Pham
Attorney, Agent, or Firm—Sandler, Greenblum & Bernstein

[57] ABSTRACT

The present invention is directed to a dynamic range enhancing system for increasing the dynamic range of a transmission link, and also to a process for increasing the dynamic range of a transmission link. An instruction setting process is also provided for defining a set of instructions, for a control device of the system, which detects, at an initial position along the transmission link, the level of a transmit signal adapted to be transmitted over the transmission link. The control device controls a first signal level changing device and a second signal level changing device in response to the detected level. The first and second signal level changing devices, respectively, process the transmit signal level before and after transmission over the link.

62 Claims, 17 Drawing Sheets

OTHER PUBLICATIONS

Pan, J. J., "Fiber Optics Marches into Microwave Systems," *Microwave Journal*, Aug. 1982, pp. 93–98.

Carlin, J. W., et al., "Direct Fiber Optic Transmission of a Wideband Multi-Carrier Microwave Signal Spectrum to and from Satellite Earth Station Antennas," 1987 IEEE MTT-s Digest, Jun. 1987, pp. 885–887.

Heim, Peter, J., et al., "Frequency Division Multiplexed Microwave and Baseband Digital Optical Fiber Link for Phased Array Antenns," *IEEE Transactions on Microwave Theory and Techniques*, vol. 38, No. 5, May 1990, pp. 494–500.

Bernhardt, Richard C., "The Effect of Path Loss Models on the Simulated Performance of Portable Radio Systems," *Proceedings of Globecom '89*, Nov. 1989, pp. 1356–1360.

Darcie, Thomas E., et al., "Lightwave Subcarrier CATV Transmission Systems," *IEEE Transactions on Microwave Theory and Techniques*, vol. 38, No. 5, May 1990, pp. 524–533.

Way, W. I., "Frequency-dependent and Frequency-independent Nonlinear Characteristics of a High-speed Laser Diode," 1988 *IEEE MTT-S Digest*, Jun. 1988, pp. 991–994.

Howat, F., "Cell Like Performance Using the Remotely Controlled Cellular Transmitter," *Proceedings of VTC '89*, May 1989, pp. 535–541.

Koscinski, J., "Transmission of Analog FDM Signals on Fiber Optic Links," *RF Design*, Apr. 1987, pp. 31–41.

McKay, D., "Moving RF over Fiber Optics," *Communication*, Oct. 1988, pp. 30–36.

Andermo, Per-Goran, "Race Mobile," *Record of Second Rutgers Workshop on Third Generation Wireless Information Networks*, Oct. 1990, pp. 14–24.

Motorola's Reply Comments filed before FCC in general Docket 89-354, Oct. 27, 1989, Table 2.

Way, W. I. "Subcarrier Multiplexed Lightwave System Design Considerations for Subscriber Loop Applications," *IEEE Journal of Lightwave Technology*, vol. 7, No. 11, Nov. 1989, pp. 1806–1818.

Cooper, A. J., "Fibre/Radio for the Provision of Cordless/Mobile Telephony Services in the Access Newtork," *Electrontics Letters*, vol. 26, No. 4, Nov. 22, 1990, pp. 2054–2056.

Chu, T. S. et al., "Fiber Optic Microcellular Radio," *Proceedings of VTC '91*, May 1991, pp. 339–344.

Seidel, S. Y. and Rappaport, T. S., "900 MHz Path Loss Measurements and Prediction Techniques for In-Building Communication System Design," *Proceeding of VTC '91*, May 1991, pp. 921–924.

Merritt, R. P., et al., "A Cordless Access System using Radio-over-Fibre Techniques," *Proceedings of VTC '91*, May 1991, pp. 921–924.

Harvey, C., et al., "Cordless Communications Utilising Radio over Fiber Techniques for the Local Loop," *Proceedings of ICC '91*, Jun. 1991, pp. 1171–1175.

Shibutani, M., et al., "Feasibility Studies on an Optical Fiber System for Microcellular Mobile Communication Systems," *Proceedings of ICC '91*, Jun. 1991, pp. 1176–1181.

Stremler, Introduction to Communication Systems, Addison-Wesley Publishing Company, Dec. 1982, pp. 154–155.

"NYNEX Automated Position Correlated Measurement System–NAPCOMS", published by NYNEX Corporation, 1991.

Harry E. Young, "Fiber Links to Microcells", Cellular Business, Nov. 1991, pp. 20–21, 24 and 26.

Dr. Barry Leff, "The Microwave Microcell", Cellular Business, Nov. 1991, pp. 28 and 32.

Gremlund et al., Handoff Strategies in Microcellular Systems, Proceedings of VTC'91, May, 1991, pp. 505–510.

Tang, Douglas, "Fiber Optic Antenna Remoting for Multi-Sector Cellular Cell Sites"; GTE Laboratories.

PRE-TRANSMISSION PROCESSOR

POST-TRANSMISSION PROCESSOR

TWO -35 dBm EA. INPUTS

TWO -31 dBm EA. INPUTS

SYSTEM FOR CONTROLLING SIGNAL LEVEL AT BOTH ENDS OF A TRANSMISSION LINK BASED ON A DETECTED VALVE

TECHNICAL FIELD OF THE INVENTION

The present invention relates to a dynamic range enhancing system for increasing the dynamic range of a transmission link. More particularly, the present invention is directed to a dynamic range enhancing system, and a process for increasing the dynamic range of a transmission link, to thus increase the usable RF input range of the transmission link. The dynamic range enhancing system and process for increasing the dynamic range of a transmission link of the present invention are particularly well suited for use, e.g., in transmission links comprising optical components; however, the scope of potential uses is not limited to the same, and a wide variety of applications are presently intended, only some of which are enumerated herein below.

DISCUSSION OF BACKGROUND INFORMATION

Conventional vehicular cellular radio systems have stringent intermodulation and noise figure requirements, particularly for cell site equipment, where a large number of users may share receiver preamplifiers of a single cell site. An example of a conventional system is the AMPS system such as described by EHRLICH, N., et al., in "Cell Site Hardware," *Bell System Technical Journal,* January, 1979, pages 153-199. The low noise receiver preamplifier subsystem requirements of the original AMPS system included a 2.5 dB noise figure. In addition, with two RF signals of −35 dBm each at the input of the receiver preamplifier, the third-order intermodulation product at the output should be greater than 65 dB down from the level of each of the two input RF signals. This is equivalent to an input third-order intercept of −2.5 dBm, and translates to a spurious-free dynamic range of about 83 dB, assuming a channel bandwidth of 30 kHz.

Modern cell site receiver systems are capable of operating in a vehicular cellular environment characterized by high user density with all available channels loaded during the busy hour for some cells, and thus require cell site receiver preamplifiers and receivers which have high dynamic ranges. As cellular systems gradually adjust to using the U.S. digital cellular standard (US TIA TDMA; Telecommunications Industry Association Time Division Multiple Access, also commonly referred to as Digital AMPS), the overall dynamic range requirements are expected to remain stringent.

The degradation of system performance due to third-order intermodulation effects typically occurs when strong and weak signals are simultaneously amplified by the same preamplifier. Intermodulation products resulting from stronger signals may fall on or near those frequencies at which weaker signals are being received, effectively producing co-channel interference in the desired weak signal. This is particularly likely in cellular systems where the channel spacing among voice channels used in a given cell is uniform.

The input signals particularly handled by a cell site preamplifier include signals received from vehicles located near the base of a tower or building on which the receiving antenna is mounted, as well as signals received from vehicles located several miles from the cell site. Typically, cell site antennas have radiation patterns which do not provide significant antenna gain for locations at ground level and in the immediate vicinity around the cell site. Therefore, signals from vehicles located near the base of the receiving antenna typically do not produce the highest signal levels processed by a cell site preamplifier. Instead, the highest input signal levels typically come from nearby vehicles and portable terminals within the main coverage area of the antenna, such as would be the case for the fourth floor of an adjacent building. The closest distance from a cell site antenna to the nearest user terminal is typically several hundred feet.

Optical fiber cable transmission links have been used to provide low-loss transmission of RF and microwave signals over reasonably long distances. Apparently, the dominant sources of non-linearity (which causes intermodulation distortion) for such systems are optical components such as laser or light-emitting diodes used in converting electrical signals to light signals.

Many of the applications for transmission of satellite down link signals do not require extremely wide overall dynamic ranges for the optical link. Most satellite RF transmission links are ideal candidates for use with fiber-remoting technology, since satellite links are typically not affected by rapid deep fading and do not need to handle a wide range of incoming signal levels from one or more satellites simultaneously. On the other hand, cellular receiving systems must typically handle a wide range of signal levels simultaneously.

The overall dynamic range requirements are even more stringent for possible future systems which may employ low power (e.g., +10 dBm output) hand-held transceivers in a micro-cell environment. This is essentially a result of the potential for the remote antenna to simultaneously receive signals from high-powered vehicular terminals (transmitting up to +35 dBm ERP effective radiated power) and hand-held portable terminals (transmitting up to +28 dBm ERP) near the antenna, while simultaneously receiving a weaker signal from a hand-held +10 dBm output portable located 1500 feet from the antenna and perhaps not directly in a line of sight path.

In another potential scenario, an omni-directional remote antenna unit could be located on a street corner and simultaneously receive two signals from vehicles located 30 feet from the antenna, both transmitting to distant vehicular cellular cell site antennas. These vehicular terminals could be either accessing vehicular cell sites associated with the same system or could be operating in the extended spectrum segment assigned to the alternate cellular carrier and located adjacent to the frequencies utilized by the micro-cell. In this case, the received level at the micro-cell could be as high as −15 dBm for each signal. If, instead, there were two nearby hand-held portables equipped with reverse channel power control, each with an output power of +8 dBm ERP and located 15 feet from the micro-cell, the received level could be as high as −35 dBm for each signal. On the other hand, the desired input signal level coming from a distant hand-held portable user could be about −110 dBm. Based on published propagation models, the portable could actually be located anywhere from 200 to 1000 feet from the antenna. For example, see BERNHARDT, R. C., "The Effect of Path Loss Models on the Simulated Performance of Portable Radio Systems," *Proceedings of Globecom '89,* November 1989, pages 1356-1360.

Therefore, a spurious-free dynamic input range of greater than about 75 dB is required where two hand-held portables generate intermodulation products, and greater than about 95 dB is required where the two nearby vehicular transmitters are causing intermodulation distortion. For the case where an FM system's performance is determined by the level of co-channel intermodulation noise, the desired incoming or received signal level must be greater than the level of the intermodulation signal by the magnitude of the capture ratio, which is typically about 6 dB.

Many cellular systems employ a limited range adaptive power control for mobile transmitters to ideally utilize the minimum output power required to maintain communication with the cell sites. The typical range of adjustment by the adaptive power control is 28 dB total, with discrete steps approximately 4 dB apart. The primary benefit is reduction of co-channel interference, since the same channels are typically re-used in other vehicular cells and micro-cells within the same local cellular system. A secondary benefit of power control is the overall reduction of the incoming signals and the overall input signal level produced thereby at the cell site, thus easing pre-receiver preamplifier dynamic range requirements.

In the case of the micro-cell environment, transmitters with variable output power under cellular system control are also utilized, and these transmitters would ideally utilize a range of maximum output power levels and range of power adjustments. The reason is that while present hand-held portable units have a maximum output power of 0.6 watts, the apparent demand for a lower battery drain, shirt-pocket size unit is expected to create a market need for lower output power units capable of operating in a micro-cell environment. Also, the mobility of the terminal user allows the transmitter to be located quite close to the micro-cell antenna units. Typically, micro-cell antenna units may be placed within 10 to 30 feet of ground level.

While it is likely impractical or not cost-effective to optimize fiber optic cable antenna-remoting systems to operate in the most difficult signal level range environments, a reasonable level of performance comparable to that obtained for present cell site receiving systems, e.g., equivalent to nearly 85 dB of usable dynamic input range, would be acceptable for many signal level environments.

Early antenna-remoting systems employing intensity-modulated fiber optic cable transmission were designed to obtain a spurious-free dynamic range of 53 to about 73 dB. For example, see MEYER, L. J., "Using Fiber Optic With Analog RF Signals," *Proceedings of VTC* '89, May 1989, pages 398–400. Recently, a spurious-free dynamic range of about 77 dB has been reported by FYE, D. M., "Design of Fiber Optic Antenna Remoting Links for Cellular Radio Applications," *Proceedings of VTC* '90, May 1990, pages 622–625.

Linearization techniques have been utilized for laser diodes in laboratory settings to further provide reduction of intermodulation products generated by laser diodes. However, such linearization techniques are costly and complex. Such techniques include active pre-distortion, electro-optical feed-forward, and electro-optical feedback configurations. These active linearization techniques for laser diodes, such as disclosed by DARCIE, T. E. and BODEEP, G. E., "Light Wave Subcarrier CATV Transmission Systems," *IEEE Transactions on Micro-wave Theory and Techniques*, Vol. 38, No. 5, May 1990, pages 524–533, are apparently not yet feasible for widespread deployment. Due to the reported existence of frequency-dependent and frequency-independent intermodulation processes, the linearization alternative, especially for wide band RF signal transmission, appears impractical. Second-order predistortion has also been employed for transmitting two analog video signals or a 960 voice channel FDM (Frequency Division Multiplexed) noise-loaded test signal over a fiber optic cable utilizing a light-emitting diode, as reported by RAMADAN, M., "Analog Signals Transmission over Optical Fiber Systems," 1985 *IEEE MTT-S Digest*, June 1985, pages 303–306; but nonetheless, third-order distortion products were not cancelled.

Two antenna remoting systems which do not employ active linearization techniques to cancel laser diode distortion are described by FYE, D. M., "Design of Fiber Optic Antenna Remoting Links for Cellular Radio Applications," *Proceedings of VTC* '90, May 1990, pages 622–625 and by MEYER, L. J., "Using Fiber Optics With Analog RF Signals," *Proceedings of VTC* '89, May 1989, pages 398–400. These systems were apparently designed to provide adequate cost-effective performance in the particular environment in which they were required to be operated.

These two systems both use fixed gain RF preamplifiers, the gains of which were set so that the highest expected incoming signal would not over-drive the laser diode utilized by the optical transmission link and cause significant intermodulation noise. Neither of these two systems described in the literature was shown to have an 85 dB usable dynamic input range. It is noted that for a typical cell site application, the fiber optic link output feeds a receiver multi-coupler having one or more integral low-noise amplifiers with an optimum signal-to-noise ratio and signal-to-intermodulation noise ratio performance, so as to provide acceptable signal levels to a receiving system.

In one of the above-mentioned systems, described by Meyer of DECIBEL, the FP laser modulator has an input third-order intercept of +24 dBm. FIG. 1 shows a block diagram of an antenna remoting system described by Fye of GTE. In the GTE system, preamplifier 10 is provided having a noise figure of 2.7 dB and an RF gain of 37 dB. Further, a fiber-optic transmission link 12 is provided having an RF loss of 27 dB. An equivalent amplifier 14 shown in FIG. 1 represents the overall equivalent net gain of the GTE system, which is 10 dB. In the GTE system, the DFB laser modulator apparently has an input third-order intercept of about +27 dBm. The link output noise (due principally to the laser noise) is about −115.5 dBm measured in a 30 kHz band width, with no RF input signal. Therefore, if an RF signal at −125.5 dBm were connected to preamplifier input 16 as shown in FIG. 1, the output response of the system would be about equal to the noise level present at the output of the link with no input signal present at preamplifier input 16. A 37 dB RF gain and 2.7 dB noise figure for preamplifier 10 appear to be well suited for microcell applications, if only the lower end of the preamplifier input dynamic range is considered.

If a composite RF signal comprising two individual signals at −48.5 dBm each were connected to the preamplifier input 16, the level of the resulting two-tone third-order intermodulation product at link output 18 would still be −115.5 dBm, which is equal to the level of the random noise output for a 30 kHz bandwidth when no RF input signal is present. For the system, the input signal range over which the output third-order intermodulation product is at or below the output level of random noise with no input is known as the spurious-free dynamic input range, and for this case is 77 dB, determined by subtracting 48.5 from 125.5. This example also indicates that the link performance may be degraded if two or more input signals having levels greater than −48.5 dBm were connected to preamplifier input 16. Since the preamplifier gain is 37 dB, this translates to a maximum allowable level at laser diode modulator input 20 of −11.5 dBm for each of two signals, giving a two-tone third-order intermodulation product of 77 dB below the level of each of the two high level signals. The composite power at laser diode modulator input 20 for these two signals would be −8.5 dBm.

It is worthwhile to consider the effect of connecting signals to preamplifier input 16 at levels higher than −48.5 dBm each, particularly since it is possible in actual applications for a nearby mobile or portable transmitter to cause an input as high as −15 dBm. In a typical scenario, however, two signals at −35 dBm each are injected at the preamplifier input 16. In this case, the result for the GTE system would be: (a) two high-level signals would appear at transmission link output 18 at a level of −25 dBm each; and (b) two signals due to the third-order intermodulation of the two high-level input signals would be generated within the system and would appear at output 18 of link 12, at about 50 dB below each fundamental signal, corresponding to a power of −75 dBm for each intermodulation product at link output 18, which is equivalent to −85 dBm each referred to preamplifier input 16. These two extra undesired signals may unfortunately fall on the same frequency as a desired voice channel signal, and thus the level of a desired incoming signal falling on the same frequency must, due to capture effect, be at least −79 dBm or greater at preamplifier input 16 in order to capture the receiver at the cell site. Thus, when two higher level input signals at −35 dBm each are input at preamplifier input 16, the effective spurious-free dynamic input range for other input signals is reduced to about 44 dB (about 79−35, which is about 44 dB).

Consequently, using the FIG. 1 system, if a hand-held portable, which may be at some distance from the micro-cell antenna, were only injecting a −110 dBm signal (as was the case for a previous example), the call in progress from the portable would likely be completely disrupted by the intermodulation signals if one intermodulation product fell within the same voice channel as that occupied by the desired −110 dBm input signal. This is obviously quite undesirable.

If two input signals at an even higher level, e.g., −31 dBm for each signal, were instead injected, the fundamental signals at link output 18 would be −21 dBm each, and two-tone third-order intermodulation products would be about 42 dB below the fundamental signals, corresponding to −73 dBm for each intermodulation product referred back to the level at preamplifier input 16, effectively interfering with possible desired input signals at preamplifier input 16. In this case, for an input signal to overcome the intermodulation noise and produce a usable demodulated signal at the FM receiver, it would have to be at a level of at least −67 dBm.

Systems are typically provided to allow system control of output power for mobile and portable terminals to ease the overall dynamic range requirements for micro-cells and antenna remoting links. Unfortunately, as shown in the example above, the benefits provided by controlling the mobile or portable transmitter power would likely not be adequate to provide intermodulation performance for a micro-cell antenna remoting link, which is comparable to that now being offered by conventional cell site equipment. This is particularly true when a nearby transmitter is not controlled by the remote micro-cell antenna of interest, such as when the nearby transmitter is either served by a large vehicular cell or another local cellular system. Another system has been proposed to resolve the high-level signal problem as discussed above by substituting the preamplifier of a remoting system with an AGC (Automatic Gain Controlled) amplifier. See HOWAT, F., "Cell Like Performance Using the Remotely Controlled Cellular Transmitter," *Proceedings VTC '89*, May 1989, pages 535–541. For a system using a laser diode, the AGC action would ideally limit the output power of the preamplifier, thus preventing high total power levels from over-driving the laser diode. The gain of an AGC amplifier may alternatively be determined by the average of the signal envelope or by the peak thereof. However, this particular remedy also has a number of undesirable effects in resolving the high-level signal problem, which are noted as follows:

(a) If the AGC time constant is too slow, high signal levels may over-drive the laser diode until the loop of the AGC responds. Since the gain of the AGC is highest when the input signal level is low, the first parts of an incoming signal are amplified at maximum gain until the automatic control takes over. Consequently, a sharp peak, or overshoot, may appear at the output of a remoting system utilizing an input AGC preamplifier.

(b) If the AGC time constant is too fast, information transmitted through the use of AM (Amplitude Modulation) signals may be removed due to varied amplification by the AGC amplifier. Also, because of intentional AM on one or more high-level signals, undesirable AM may be impressed on low-level signals without intentional AM. Moreover, wide-band feedback loops typically are more prone to exhibit instabilities. Received TDMA (Time Division Multiple Access) bursts may also cause system performance problems.

(c) If the AGC loop stability parameters are not properly defined, the AGC amplifier output may exhibit undesirable ringing, overshoot, or undershoot. This is particular true when sudden large input level changes or transients are encountered.

(d) If the AGC amplifier has excessive AM/PM (Amplitude Modulation/Phase Modulation), the PM generated by the amplifier may degrade the quality of the signals being amplified.

(e) Depending on the specific implementation, AGC amplifiers may exhibit poor noise figure and/or degraded linearity (including excessive compression, expansion or third-order intermodulation effects) at some input levels.

(f) Since most cellular systems employ reverse channel power control, the effect of an AGC amplifier would be to remove the desired effect resulting from a change of transmitter power level. This reduction in overall link gain as the system input power level increases may in turn cause a system performance degradation or transmitter power control instability.

Some of the problems listed above arise as a result of the fact that an AGC amplifier is typically a type of feedback amplifier, which has inherent technical challenges regarding loop timing. For example, a correction is only initiated when it is already "too late," and an error (in the sense of an unduly high or low instantaneous output level) has already been detected at the output.

Another way some systems have attempted to resolve the high-level input problem is by selecting a lower fixed RF gain for the preamplifier, or by installing a fixed attenuator in series with the input and/or output of the preamplifier. These measures effectively reduce the signal-to-noise ratio at the laser diode for the entire input range, and potentially degrade the overall performance at all input signal levels as a trade-off for providing lower intermodulation distortion levels for high system input power conditions.

Another way of addressing the high-level input problem is to utilize a limiting amplifier or a fixed gain amplifier with a low output power capability. In most cases, this approach increases the level of intermodulation products generated by the preamplifier and generally raises the level of intermodulation noise generated by the preamplifier, making it approximately equivalent to the level of the intermodulation products caused by the laser diode or light-emitting diode, and typically doubling the total transmission link intermodulation noise. There is also a large potential for introducing AM/AM distortion and AM/PM distortion for the system input signals being processed with this approach. Without employing some type of output power compression or limiting capability, the preamplifier would be capable of over-driving the laser or light-emitting diode by about 20 dB or more, potentially introducing a substantial amount of intermodulation noise.

It should be noted that the above-mentioned high-level signal problem may also occur when using free-space optical links, since the laser or light-emitting diode noise and intermodulation characteristics thereof could also potentially limit the overall dynamic range of an RF transmission link using free-space optical transmission.

A further potential remedy for the above-mentioned problem would involve the use of advanced antennas, such as those adaptive phased arrays capable of attenuating signals with too high an input signal level. An additional possibility is the use of a fixed array with reduced capability to receive signals from transmitters located extremely close to and underneath the antenna, for example, if it were mounted to a tall pole or antenna mast.

An additionally related problem which may potentially occur with micro-cell antenna remoting systems relates to the fiber-optic cable and/or free-space optical link used in transmission of signals in the opposite direction, that is, from the cell site toward the remote antenna unit. In the event a single cell site transmitter's power control function misadjusts the output power to an abnormally high level, the laser or light-emitting diode of the optical transmission link may generate excessive intermodulation products and cause the remote unit to no longer meet FCC requirements for spurious radiation. The potential also exists for causing interference to other radio systems using radio channels adjacent to those utilized by the micro-cellular system employing the antenna remoting system. To address this problem, many of the remedies listed above would likely not offer a practical solution.

A technique which is employed in voice processing systems (including those used in cellular networks and satellite transmission systems) is known as companding. This involves a device located at the source end (a compressor) which compresses the dynamic range of a given signal (of a typically low band width) by a given factor before it is transmitted over a limited dynamic range transmission path. At the distant end, a device known as an expander restores the original dynamic range of the complex signal, utilizing the same factor as utilized in the compression process. Such a device is of limited value for most micro-cell antenna remoting applications since it would need to have an extremely wide loop band width (likely about 50 MHz for this application) in order to instantaneously compress and then expand the dynamic range. Further, it is noted that the compressor and expander devices of a companding system both utilize non-linear feedback loops (potentially exhibiting transient response errors and instability) to vary the gain as a function of the instantaneous input or output level, potentially causing undesirable distortion effects due to residual expansion or compression.

The technical literature apparently does not address means typically provided for alarm reporting, self-test, and remote control functions, for fiber optic cable or free-space optical antenna remoting systems. Such systems may employ separate means such as on-site troubleshooting or perhaps direct wired or dial-up alarm reporting facilities. One system described in the literature utilizes a fiber optic cable system to distribute both microwave signals and digital base band signals which are both directly intensity modulated. See HEIM, P. J. and McCLAY, C. P., "Frequency Division Multiplex Microwave and Baseband Digital Optical Fiber Link for Phased Array Antennas," *IEEE Transactions on Microwave Theory and Techniques*, Vol. 38, No. 5, May 1990, pages 494–500.

One disadvantage of utilizing digital modulation is the inherent phase noise build-up on all microwave signals resulting from the dual-mode (RF and Digital) direct modulation process. As a result, some types of antenna remoting system applications would not permit the use of direct baseband digital modulation for control and alarm reporting functions.

Due to the limited effective dynamic range of existing remote micro-cell antenna units or radio ports, a relatively large quantity of remote radio ports would be required using such existing systems for micro-cell applications in a given geographical area. Thus, a significant amount of hardware and maintenance costs for additional remote radio ports would result if existing systems were used.

The high dynamic range required for a micro-cell radio port has recently been discussed in detail. A radio port with a high dynamic range will potentially provide a greater practical operating distance for many micro-cell applications, so as to potentially reduce the number of radio ports required to cover a given geographical area or indoor facility. If radio ports with low dynamic range are employed, the number of radio ports required to cover a given area would be higher, likely increasing the system cost.

In contrast to the above described existing systems, the dynamic range enhancing system, and the process for increasing the dynamic range of a transmission link, according to the present invention, overcome most if not all of the above-mentioned problems and result in a dynamic range enhancing system which provides a number of advantages.

OBJECTS OF THE INVENTION

Accordingly, an object of the present invention is to provide a system which enhances or increases the overall dynamic input signal range for spurious-free operation of signal transmission systems. In accordance with a particular aspect of the present invention, the overall dynamic range of a link is enhanced while preserving the overall fixed gain characteristic of the link. Thus, stability of automatic transmitter power control systems which control the levels of some signals processed by the link may be ensured. Further, the system preserves integrity of AM modulation which may be intentionally present on some signals. Moreover, the enhanced dynamic range characteristic of the present invention reduces the chance of dropped calls for portable terminal users of micro-cellular telephone systems, by preventing undesired intermodulation products from falling within the desired radio channel.

Another object of the present invention is to provide cost-effective alarm reporting, self-testing, and control for a remotely-located antenna unit, by allowing transmission of such supervisory and maintenance signals over the transmission link. Another object of the present invention is to provide a dynamic range enhancing system, and a process for increasing the dynamic range of a transmission link having electro-optic components, wherein the system and process reduce the chance of damaging a laser or light-emitting diode due to high input signals.

A further object of the present invention is to eliminate the need for employment of feedback, feedforward, or pre-distortion linearization techniques in trying to increase the dynamic range of a transmission system. Further, another object of the invention is to eliminate the need for utilization of amplifiers with linear and non-linear feedback elements, and therefore provide a system which is capable of handling a wider range of input signals than a typical AGC amplifier or companding system, without exhibiting undesirable instability or excessive distortion.

Another object of the present invention is to provide a system and process which allow a control signal to travel over the transmission link without the use of direct digital base band modulation. Thus, phase noise characteristics of RF signals transmitted over the link are not degraded.

Another object of the present invention is to provide a dynamic range enhancing system, wherein the transient response of a transmission system may easily be optimized for a wide range of applications through the use of optional fixed time delays. Moreover, it is an object of the present invention to enhance the overall dynamic range of a transmission system without the need for a wideband feedback loop, which is typically required with companders. Thus, a particular object of the present invention is to provide a dynamic range enhancing system which ensures an adequate loop stability over a wide range of input signal types likely to be encountered in actual operating systems. For optical link applications, by achieving this object, the present invention allows for the use of lower cost lasers or light-emitting diodes with less stringent linearity output and noise characteristics. Thus, the system of the present invention reduces overall cost while achieving the noted objectives.

Further, an object of the present invention is to reduce cost by eliminating the need for advanced antennas with fixed or steerable nulls to attenuate potentially high-level input signals, thus allowing for flexibility in selecting locations for installation of micro-cell antenna units.

A further object of the present invention is to enhance the dynamic range of transmission systems pertaining to a broad class of RF signals. Such transmission systems may include fiber optic cable or free-space optical systems with star or similar architectures, whereby a number of RF-FDMA, CDMA, or TDMA signals from several users (with varying and perhaps unequal RF levels) are passively or actively combined at a single point.

A further object of the present invention is to allow transmission of optically-encoded associated attenuator control signals along with a processed RF transmit signal, to thus allow utilization of more than one optical receiver physical location, providing point-to-multipoint distribution.

A further object of the present invention is to provide a system for increasing the dynamic range of a microcell radio port interconnection and signal distribution system, which would thus decrease the required quantity of remote radio ports which would be required to serve a given geographical area. Thus, by achieving this object, a substantial cost reduction in hardware, radio port deployment, and radio port maintenance can be achieved via use of the present system.

Another object of the present invention is to provide a system and process which are applicable for use with RF transmission systems, and particularly for use with transmission links for transmitting RF electro-magnetic signals from point A to point B. In this regard, a particular objective of the present invention is to increase the useable input signal level range of transmission links, which may be defined as devices or systems for transmitting from a first location to a second location displaced from the first location. In one particular aspect of the present invention, the useable input signal level range of a transmission link is increased by decreasing intermodulation effects of one or more components of the transmission link.

Such transmission links can include, e.g., typical RF transmission links, fiber optic cable links, free-space optical links, radio wave transmission links, and any combination of the above elements. The invention may also be utilized for purposes other than physically extending communications capabilities, such as for physically short transmission links intended primarily for another purpose, such as Fiber Optic Delay Lines (coiled up, occupying a few cubic feet). The control signal could be directly wired from one end of the delay line to the other end, eliminating the modulator and demodulator for applications where it is more practical to do so. Other applications of the present invention are tandem fiber optic cable and free-space optical links, potentially using optical repeaters.

SUMMARY OF THE INVENTION

Accordingly, one aspect of the present invention is directed to a dynamic range enhancing system for increasing the dynamic range of a transmission link. Typical applications include those where the quantity and level of individual signals which comprise a composite input signal are random and change over time. The system is provided with a control device which detects, at an initial position along the transmission link, the level of a transmit signal adapted to be transmitted over the transmission link. The control device also controls a first signal level changing device and a second signal level changing device in response to the detected or measured level. The first signal level changing device is configured so that it processes the transmit signal before transmission over the link, and the second signal level changing device is configured so that it processes the transmit signal after transmission over the link.

In accordance with one aspect of the dynamic range enhancing system of the invention, the first and second signal level changing devices and the control device are configured to change the level of the transmit signal in a coordinated fashion.

In another aspect of the present invention, the first and second signal level changing devices each change the level of the transmit signal present at its output. In yet another aspect the first and second signal level changing devices each have defined signal level changing ranges, whereby they can change the signal level of the transmit signal present at their respective outputs by an amount up to and including a maximum change in value. In yet another aspect, the control device controls the first signal level changing device and the second signal level changing device to both be at ends of their defined signal level changing ranges, when the detected level of the transmit signal is below a first threshold.

In another aspect of the present invention, when the detected level of the transmit signal is below the first threshold, the first signal level changing device is set at the most increased end of its defined signal level changing range, whereby the signal level present at its output is at a maximum possible value, and the second signal level changing device is set at the most decreased end of its defined signal level changing range, whereby the signal level present at its output is at a minimum possible value.

In yet another aspect of the present invention, the control device controls the first signal level changing device to decrease the level of the transmit signal present at its output by an amount approximately equal to the amount by which the detected level exceeds a first threshold value, when the detected level is above the first threshold value. The control device may also concurrently control the second signal level changing device to increase the level of the transmit signal present at its output by an amount approximately equal to the amount by which the detected level exceeds the first threshold value, when the detected level is above the first threshold value.

In a further aspect of the present invention, the control device controls the second signal level changing device to be at the most increased end of its defined signal level changing range, whereby the signal level present at its output is at its maximum possible value, when the detected level of the transmit signal is above a second threshold which is greater than the first threshold.

In another aspect, the control device is configured to produce first and second control signals to respectively control the first and second level changing devices, and the control device may also be configured to transmit information containing the second control signal over the transmission link.

In another aspect of the present invention a modulator modulates the second control signal, and a demodulator demodulates the modulated version of the second control signal.

In a particular aspect, the demodulator comprises a bias control unit for performing an operation on the demodulated version of the second control signal and based on the operation, outputting a signal which is proportional to the detected level of the transmit signal.

In this regard, the system may further comprise a power amplifier, having a bias control port, connected to an output of the second signal level changing device, and the bias control unit may be connected at its output to the bias control port of the power amplifier.

In another aspect, the demodulator may have a bias control unit for determining if the demodulated version of the second control signal is below or above a predetermined threshold value. In this regard, the bias control unit may output a signal having a first value when the demodulated version of the second control signal is below the predetermined threshold value and having a second value when the demodulated version of the second control signal is above the predetermined threshold value.

The system may further comprise a power amplifier, having a bias control port, connected to an output of the second signal level changing the device, and the bias control unit may be connected at its output to the bias control port.

In one aspect of the dynamic range enhancing system of the present invention, the transmit signal is an RF signal comprising a variable number of input signals.

In yet an additional aspect of the dynamic range enhancing system of the present invention, one end of the transmission link is coupled to one or more of radio channel transceivers and receivers and a second end of the transmission link is coupled to a remote antenna. In another aspect, the dynamic range comprises a usable RF input signal range of the transmission link.

In an additional aspect of the dynamic range enhancing system, the control device comprises a device for measuring the instantaneous composite power level of the transmit signal before transmission over the transmission link. In this regard, in another aspect, the measuring device may measure the total average (RMS) RF signal level of the transmit signal before transmission over the transmission link. Also, the measuring device may be configured to further characterize the spectrum of the transmit signal by measuring the AC characteristics of the transmit signal before transmission over the transmission link.

In an additional aspect of the dynamic range enhancing system of the invention the control means comprises a device for monitoring the power level of the transmit signal before pre-transmission processing by the first level changing device.

In yet an additional aspect of the dynamic range enhancing system, the first level changing device is positioned at an input location of the transmission link, and the second level changing device is positioned at a second output location of the transmission link.

In another aspect of the dynamic range enhancing system, the transmission link is configured to transmit a signal from a first location to a second location remote from the first location.

In one aspect of the invention, the control device is connected directly to the first and second signal level changing devices. On the other hand, in another aspect, the control device is connected directly to only the first signal level changing device, while it is connected to the second one via the transmission link.

The first signal level changing device may comprise a first variable attenuator, and the second signal level changing device may comprise a second variable attenuator. On the other hand, one or both of the first and second signal level changing devices may comprise a gain controlled amplifier. Moreover, one or both of the first and second signal level changing devices may comprise both a variable attenuator and a gain controlled amplifier.

In one particular aspect of the dynamic range enhancing system of the present invention, the transmission link comprises an optical link. Additionally, one or more time delay circuits may be provided to compensate for time delays caused by the control device, and a service channel transmission system may be provided for conducting maintenance communication and/or supervisory alarm and control across the transmission link. In yet a further aspect, the control device comprises a system, including a variable attenuator, for remotely verifying proper operation of the system and determining the dynamic range of the system.

In accordance with yet another aspect of the dynamic range enhancing system of the present invention, there is also provided a tandem combination of at least one amplifier and at least one attenuator coupled to a first input location of the transmission link, wherein the tandem combination comprises the first signal level changing device. The tandem combination may comprise a first pre-amplifier, a first attenuator, a second pre-amplifier, and a second attenuator, connected in cascade, and the control device may comprise a directional coupler, a monitor device, a DC processor, an AC processor, a combining device for processing and combining signals output by the DC processor and the AC processor, and an attenuator control device for controlling attenuation values of at least one of the attenuators in the system. The directional coupler is connected to an output of the first preamplifier, and is adapted to feed an amplified sample of the transmit signal to the monitor device, and the monitor device is adapted to receive the amplified sample and provides a rectified version of the transmit signal in the form of a video signal having a bandwidth typically greater than 1 MHz, and a spectrum position corresponding to a direct-current carrier. In addition, the DC processor is configured to provide a DC measurement signal of the video signal, wherein the DC measurement signal is proportional to the instantaneous composite RF level at the output of the first preamplifier, and the AC processor is configured to provide an AC measurement signal based on an AC analysis of the video signal, wherein the AC measurement signal is indicative of the instantaneous second-order intermodulation products at the output of the monitor device which provides the video signal (generated during the nonlinear rectification process).

The means by which the second control signal is transmitted over the transmission link may comprise an FM/FSK, PM/PSK, or AM/ASK control signal modulator, and the control device may also comprise a time division multiplexed (TDM) or frequency division multiplexed (FDM) control interface.

The system may further comprise a downward frequency converter for converting the transmit signal to a lower frequency before transmission over the link, and may also comprise an upward frequency converter for converting the transmit signal to a higher frequency after transmission over the link.

In another aspect of the dynamic range enhancing system, the transmit signal is transmitted over the transmission link from a side of the transmitted link which is connected to a remote antenna, or alternatively to a side connected to a remote antenna.

The downward frequency converter may be configured to act on the transmit signal before processing by the first signal level changing device. Similarly, the upward frequency converter may be configured to act on the transmit signal after processing by the second signal level changing device.

In accordance with another aspect of the dynamic range enhancing system of the present invention, the control device comprises a plurality of controllers, the first signal level changing device comprises a first set of signal level modifiers, and the second signal level changing device comprises a second set of signal level modifiers. Each of the controllers and each modifier of the first and second sets are adapted to separately and independently provide dynamic range enhancement for respective separate frequency bands of the transmit signal.

In a particular aspect of the present invention, the first and second sets of signal level modifiers are identical in number. In addition, the system may comprise a respective filter for each of the separate frequency bands of the transmit signal, a combining network connected to the input of the transmission link, and a splitting network connected to the output of the transmission link.

Another aspect of the present invention is directed to a process for increasing the dynamic range of a transmission link wherein a number of steps are carried out. The level of an actual transmit signal adapted to be transmitted over the transmission link is detected, and a table of values is created having a plurality of signal codes representing the detected level of the transmit signal. The table also has a plurality of signal level modification codes, respectively corresponding to the signal level codes. A set of control instructions is defined setting forth certain parameters, wherein the instructions are established as a function of the detected level of the transmit signal. In a particular aspect of the process, in accordance with the detected level of the actual transmit signal and within the parameters set forth by the instructions, the transmit signal is modified at first and second locations along the transmission link.

In another aspect of the process of the present invention, the amount of high level input signals that are in the transmit signal is approximated. It is also determined whether the approximated amount of signals is within a first range of values or a second range. The transmit signal is modified at first and second locations along the transmission link according to a first configuration when the approximated number of high level signals is within the first range. On the other hand, the actual transmit signal is modified at first and second locations along the transmission link according to a second configuration when the approximated number of high level signals is within the second range.

In a particular aspect of the process of the present invention, the first location is at an input of the transmission link and the second location is at an output of the transmission link.

Another aspect of the present invention is directed to a process for increasing the dynamic range of a transmission link, wherein a number of steps are carried out. The level of a transmit signal, which is adapted to be transmitted over the transmission link, is detected at an initial position along said transmission link. Based upon the detected level, the level of the transmit signal is independently controlled at a first location before the transmission link and at a second location after the transmission link.

In another aspect, a pre-transmission processing of the transmit signal is carried out at the first location, and a post-transmission processing of the transmit signal is carried out at the second location. In yet another aspect, information is transmitted over the transmission link to control the level of the transmit signal at the second location.

In another aspect of the process, the level of the transmit signal at the first location is decreased by an amount approximately equal to the amount by which the detected level exceeds a threshold value, when the monitored level is above the threshold value. Additionally, the level of the transmit signal at the second location may be concurrently increased by an amount approximately equal to the amount by which the monitored level exceeds the threshold value, when the detected level is above the threshold value.

BRIEF DESCRIPTION OF THE DRAWINGS

The above and other objects, features, and advantages of the present invention are further described in the detailed description which follows, with reference to the drawings by way of non-limiting examples of preferred embodiments of the present invention, wherein like reference numerals represent similar parts of the present invention throughout the several views, and wherein.

DETAILED DESCRIPTION OF THE PREFERRED EMBODIMENTS

Figure 1:
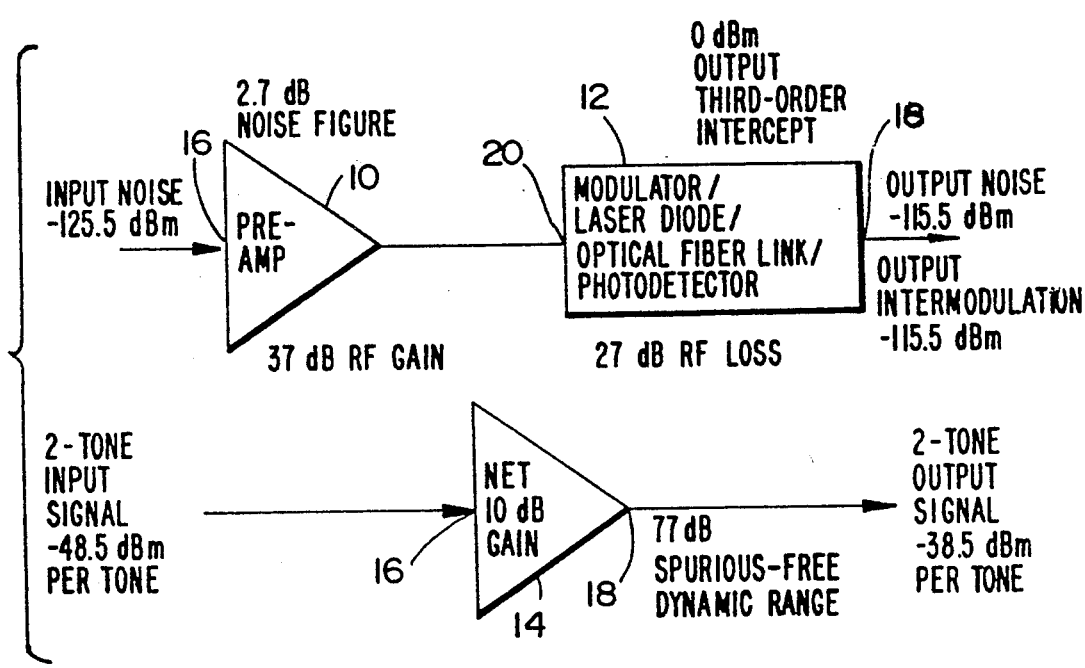
FIG. 1 is a block diagram of a GTE antenna remoting system.
Figure 2:
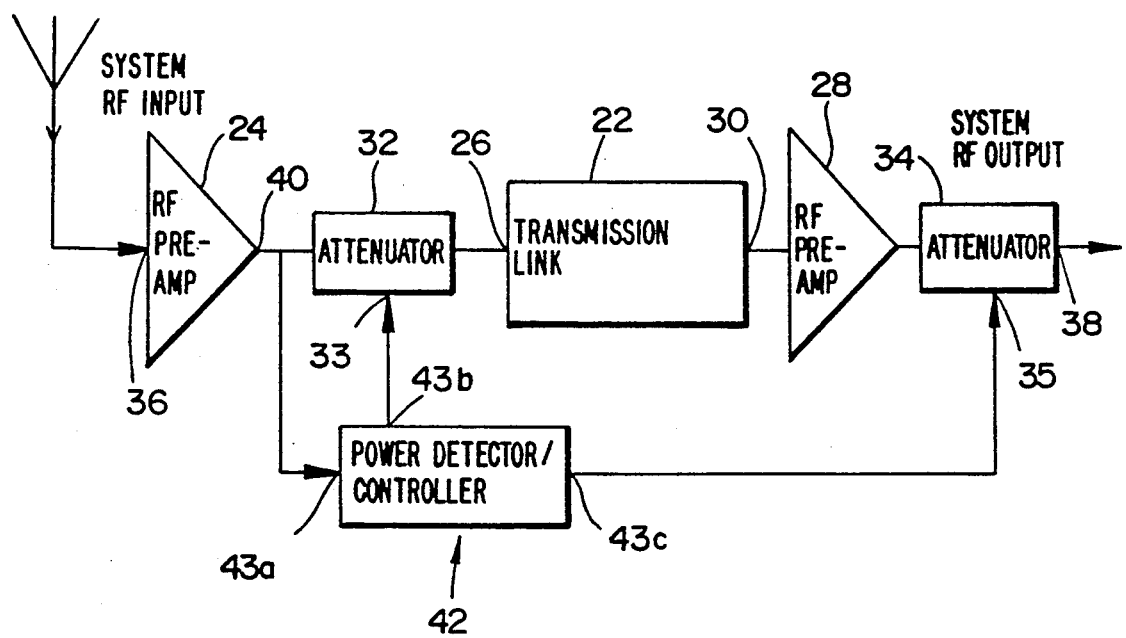
FIG. 2 depicts a simplified block diagram of a first embodiment of a dynamic range enhancing system of the present invention, which can be, e.g., specifically applied to an optical transmission link.

One embodiment of the dynamic range enhancing system of the present invention is illustrated by way of a simplified block diagram in FIG. 2. Transmission link 22 is illustrated (in this embodiment) as a well known conventional optical link, which includes a laser diode modulator or light emitting diode (LED) modulator, a laser diode or LED, an optical link, and a photo detector (not individually illustrated). Transmission link 22 is connected to a first preamplifier 24 at input 26 and to a second preamplifier 28 at output 30. First signal level changing device 32 is positioned between output 40 of preamplifier 24 and input 26 of transmission link 22, and second signal level changing device 34 is connected to the output of second preamplifier 28. Thus, first preamplifier 24, first signal changing device 32, transmission link 22, second preamplifier 28, and second signal level changing device 34 are respectively connected in cascade. Input 36 of first preamplifier 24 comprises the total system input, and output 38 of second signal level changing device 34 comprises the total system output.

Control device 42 is provided with an input 43a which is connected to output 40 of first preamplifier 24. First output 43b of control device 42 is coupled to control input terminal 33 of first signal level changing device (e.g., attenuator) 32, and second output 43c is coupled to control input terminal 35 of second signal level changing device (e.g., attenuator) 34.

The operation of the present invention may be described as follows with reference to FIG. 2. An RF transmit signal is adapted to be processed by the system and transmitted over transmission link 22 via system input 36. The transmit signal is amplified by first preamplifier 24, and is in turn split in two ways. A sample of the transmit signal is fed to control device 42, while a significant portion of the transmit signal is routed to first signal level changing device 32, which is shown in this embodiment to be a variable programmable attenuator. Control device 42 measures the instantaneous composite power present at output 40 of first preamplifier 24, and based on the power level measured, generates two control signals for respectively setting attenuation levels of first and second signal level changing devices 32, 34. If the power level at output 40 of first preamplifier 24 is below a predetermined threshold (as determined by control device 42), then control device 42 sets the attenuation level of the first attenuator of first signal level changing device 32 to a given low value and sets the attenuation level of the second attenuator of second signal level changing device 34 to a given high value.

On the other hand, if the power level detected by control device 42 is above a predetermined threshold, then control device 42 sets the attenuation levels of the first and second attenuators of first and second signal level changing devices 32, 34 in an opposite manner. That is, the attenuation level of the first attenuator is set to a given high value, and the attenuation level of the second attenuator is set to a given low value. According to this particular embodiment, the attenuation levels of the first and second attenuators of first and second signal level changing devices 32, 34 are set such that the overall system gain from input 36 to output 38 remains constant, regardless of the power level detected by control device 42.

In this particular embodiment, as shown in FIG. 2, transmission link 22 comprises a laser or light-emitting diode modulator, an optical link, and a photo detector (not shown). Thus, in this embodiment, the transmit signal present at input 26 of transmission link 22 is routed to a laser or light-emitting diode modulator and is converted to an optical signal which is transmitted over the optical link. The transmit signal is in turn converted back to an RF transmit signal by a photodetector. The RF transmit signal is then amplified by second preamplifier 28, whose output is in turn routed to the input of second signal level changing device 34. The RF transmit signal of the system is in turn taken from system output 38 at the output of second signal level changing device 34.

If the system input signal present at system input 36 is at a power level below a first threshold and subsequently increases in power by only a slight amount whereby the power level remains below the first thresholds the settings of attenuation for first and second signal level changing devices 32 and 34 remain at their respective given low value of attenuation for the first signal level changing device and given high value of attenuation for the second level changing device.

If the input power of the input transmit signal as detected by control device 42 slowly but continually rises (due to a continual increase in system RF input power) to a value above the first threshold, control device 42 will adjust the attenuation level of first attenuator 32 to a higher attenuation value. The higher attenuation value is set in order to ensure that the maximum value of power selected to be present at input 26 of transmission link 22 is not exceeded. For every one dB increase of system RF input power above the first threshold, the setting of first attenuator 32 increases its attenuation by one dB. Concurrently, control device 42 generates a control signal to set second attenuator 34 to a lower level of attenuation than set previously, by an amount equal to the amount that the setting of the first attenuator 32 is being changed. Similarly, for every one dB increase of system RF input power, the setting of second attenuator 34 decreases its attenuation by one dB. As first signal level changing device (first attenuator) 32 and second signal level changing device (second attenuator) 34 respond simultaneously by changing their respective attenuation levels equally in opposite directions, the net system gain from system input 36 to system output 38 remains constant. As the system input power level rises, the RF signal power present at transmission link input 26 remains nearly constant.

Control device 42 effectively measures the system input power present at output 40 of the first preamplifier 24, and determines if the power is above a predetermined threshold. If the power is above a threshold, control device 42 calculates how far the power is above the threshold. If, for example, the power is 5 dB above the threshold, the power control device increases the attenuation setting of first attenuator 32 by 5 dB above its given zero input power setting and simultaneously decreases the attenuation setting of second attenuator 34 by 5 dB below its given zero input power setting.

It is noted that extreme accuracy for the power detecting function of control device 42 is not required for most applications. In addition, for many applications, the attenuation levels of first and second signal level changing devices 32, 34 need not be extremely precise. For a microcell and antenna remoting application, measurement of the power level present at output 40 of first preamplifier 24 should be adequate information upon which to base control of first and second signal level control devices 32 and 34. Further, an accuracy of 0.5 dB for the attenuation setting of the first and second attenuators should be adequate for such an application.

If the power level of the system RF input signal continually rises past a point, i.e., a second threshold, where second attenuator 34 has already been set to its minimum attenuation, control device 42 may optionally be programmed to set second attenuator 34 at its minimum attenuation value, but at the same time continue increasing the attenuation level of first attenuator 32 by 1 dB for each one 1 dB increase of system RF input power level. Assuming a continual power level increase, from the point (the second threshold of input power) at which second attenuator 34 reaches its lowest attenuation setting such that both attenuator settings can no longer change concurrently or simultaneously and equally in both directions, to a third threshold of input power, the overall system gain begins to decrease steadily as the system RF input signal level continues to increase until eventually first attenuator 32 reaches its maximum attenuation setting. While the system is in this mode, where only first attenuator 32 is being adjusted to compensate for an increase in input power level, the system intermodulation ratio (that is, the ratio of high-level signal to third-order intermodulation products) present at system output 38 nonetheless remains constant or nearly constant as the system input power level detected at preamplifier output 40 changes. This is because the system intermodulation performance is determined primarily by the non-linear characteristics of transmission link 22 (which in this case are caused by a light-emitting or laser diode of an optical transmission link 22), and further because the RF transmit signal power level is maintained at an almost constant level at input 26 to transmission link 22.

However, in this single (i.e., only first attenuator adjustment) mode of the dynamic range enhancing system, the system noise figure actually degrades as the system input power rises. This is nonetheless not detrimental to system performance, since the noise figure degrades at an almost linear dB-for-dB rate of increase in noise figure versus increase in input power level. Thus, the output signal-to-random-noise ratio (S/N) remains almost constant with changing input power level.

For many applications, the constant intermodulation ratio and acceptable S/N ratio characteristics of the dynamic range enhancing system of the present invention result in a significant improvement in reducing system-generated distortion products potentially resulting in interference with desired signals, as compared with conventional fixed-gain preamplifier systems.

At high input power levels, for every one dB increase in system input level, a fixed-gain amplifier approach typically provides a 2 dB degradation in intermodulation noise ratio and a 1 dB increase in output random noise (S/N) ratio. For the fixed-gain approach, this gives a net degradation of the signal-to-interference (internally generated) ratio of about 1 dB for every 1 dB increase in the system input power.

On the other hand, the system of the present invention as described in FIG. 2 provides a nearly constant intermodulation noise ratio for system input power levels above a predetermined input threshold. Further, it provides a relatively slight increase in random noise (S/N) ratio for every one dB increase in system input power. This comparison explains the mechanism for enhancing the overall dynamic range of transmission which is provided by the present system, by allowing signals at powers above a predetermined input threshold to be transmitted over the link without significant degradation caused by system generated noise.

When low to normal level input signals are present (and the input power level is between zero and a first threshold value), the dynamic range enhancing system of the present invention operates similarly to a system employing a fixed-gain preamplifier. When extremely high-level input signals are present and the input power level is between second and third threshold values (that is, when attenuator 34 has already reached the minimum attenuation end of its range, and yet the attenuation of attenuator 32 is still increasing), the invention provides a function similar to that of a feedforward AGC (Automatic Gain Controlled) amplifier.

Because of the use of high dynamic range programmable attenuators rather than voltage-controlled gain amplifiers, and because of the feedforward approach of the present invention, this configuration, unlike most AGC amplifiers, provides extremely low AM/PM (Amplitude Modulation/Phase Modulation) conversion and has the potential for delivering exceptional transient response. This enables a system employing the invention described herein to process a wide range of modulation formats (separately or simultaneously) without introducing significant distortion.

For purposes of further clarification, the specific operation of the signal level changing devices of the present invention will now be described in more detail. The four operating regions discussed below refer to ranges of specific signal input levels with respect to the three thresholds which are utilized to determine operation and proper settings of the two signal level changing devices.

| | |
|---|---|
| Region 1: | |
| Input Level: | From zero input signal up to first threshold value. |
| Status: | Neither first nor second signal level changing devices in active range. |
| Settings: | First level changing device set to minimum loss, and second signal level changing device set to maximum loss. |
| Overall Gain: | Constant as a function of input signal level. |
| Region 2: | |
| Input Level: | From first threshold value up to second threshold value. |
| Status: | Both of signal level changing devices in active range. |
| Settings: | First level changing device set to decrease the level of the transmit signal at input 26 of the transmission link 22 by an amount approximately equal to amount by which input signal is above the first threshold, and second signal level changing device 34 is set to increase the level of the transmit level at system output 38 by amount approximately equal to the amount by which the input signal is above the first threshold. The control device 42 controls the signal level changing devices so that the respective changes in level of the transmit signal are equal in value but opposite in direction. |
| Overall Gain: | Constant as a function of input signal level. |
| Region 3: | |
| Input level: | From second threshold value up to third threshold value. |
| Status: | First level changing device in active range, but second level changing device not in active range. |
| Settings: | First level changing device set to decrease the level of the transmit signal at input 26 of transmission link 22 by an amount approximately equal to the amount by which the input signal is above the first threshold, and the second signal level changing device is set at its minimum loss. |
| Overall Gain: | Reduced as the level of the input signal increases. |
| Region 4: | |
| Input Level | Above third threshold. |
| Status: | Neither first nor second signal level changing devices in active range. |
| Settings: | First level changing device set at its maximum loss, and second signal level changing device set at its minimum loss. |
| Overall Gain: | Lowest possible overall gain, constant as a function of input signal level. |

A second embodiment of a dynamic range enhancing system of the present invention will now be described with reference to FIG. 3.

Figure 3:
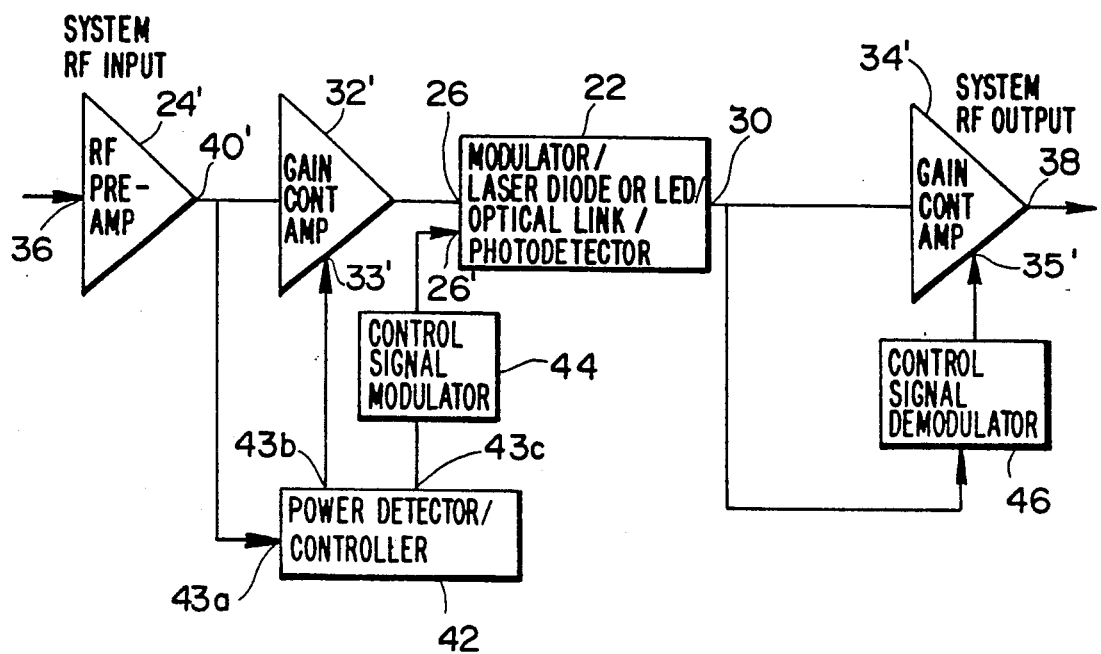
FIG. 3 is a block diagram illustrating a second embodiment of the dynamic range enhancing system of the present invention, wherein the first and second signal level changing means comprise programmable gain controlled amplifiers.

In the second embodiment depicted in FIG. 3, elements similar to those of the embodiment of FIG. 2 are presented by the same reference numerals. Transmission link 22 has a preamplifier 24' and first signal level changing device 32', both connected in cascade to input 26, and also has second signal level changing device 34' connected at its output 30. Instead of two fixed-gain preamplifiers 24 and 28, as included in the first embodiment shown in FIG. 2, in this embodiment only one preamplifier 24' is used, which is provided at the input of the system. Another difference from the first embodiment is that first signal level changing device 32' comprises a first programmable gain control amplifier and second signal level changing device 34' comprises a second programmable gain control amplifier. Control device 42 is again provided in this embodiment, with output 40' of amplifier 24' connected to input 43a of control device 42. Further, similarly to the previous embodiment, first output 43b of control device 42 is connected to programming control input 33' of first programmable gain control amplifier 32'. Control signal modulator 44 is connected at its input to second output 43c of control device 42, and is connected at its output to input 26' of transmission link 22. Corresponding control signal demodulator 46 is placed between output 30 of transmission link 22 and programmable input 35' of second programmable gain control amplifier 34'.

This embodiment is configured to transmit a feedforward control signal over transmission link 22 to control second signal level changing device 34', whereas in FIG. 2 the control signal was transmitted directly to device 34. The control signals emitted by control device 42 at first and second outputs 43b and 43c may comprise either analog or digital signals, depending upon the configuration and type of gain control amplifiers used for first and second signal level changing devices 32' and 34'. A second of the two control signals produced by control device 42, which is intended to control second gain control amplifier 34', enters control signal modulator 44, which in turn produces an RF carrier modulated by the second control signal. The modulation type may be FM (Frequency Modulation), FSK (Frequency Shift Keying), PM (Phase Modulation), PSK (Phase-Shift Keying), AM (Amplitude Modulation), ASK (Amplitude Shift Keying), or a combination of these, as may be implemented by one of ordinary skill in the art and as the particular application may dictate. This resulting modulated RF second control signal is then coupled along with the processed RF transmit input signal (i.e., the signal which is already pre-transmission processed by first gain control amplifier 32') into transmission link 22 at the input of a light-emitting or laser diode modulator (whichever is used as part of link 22; neither is shown, however). The frequency of the RF carrier generated by control signal modulator 44 is typically selected to avoid interfering with any of the desired system input signals present in the RF transmit signal.

The combined signal, comprised of the system input RF transmit signal processed by first signal level changing device 32' and the modulated second control signal, is then converted to an optical intensity-modulated signal and subsequently transmitted over transmission link 22, which may be an optical fiber cable link or a free-space optical link, or any other transmission link within the general applicable scope of the present invention (i.e., any transmission link which needs a system for increasing its dynamic range by decreasing intermodulation distortion effects caused at some point in the transmission link).

Both signals are located at output 30 of transmission link 22, and are simultaneously converted back to low-level RF signals by, e.g., a photo detector (in the case of an optical link). A sample of the signal at output 30 of transmission link 22 is fed into control signal demodulator 46, wherein an internal filter selects only the desired control signal, which is thus demodulated.

In the event that a second preamplifier was provided between transmission link 22 and gain control amplifier 34' the control signal pick-up point for inputting to control signal demodulator 46 could be located at either the input of the second preamplifier or at the output of the second preamplifier. However, if the pick-up is located at the output of the second preamplifier, the signal must be within the effective RF band width of the second preamplifier. Typically, the level of the transmitted control signal is quite low with respect to most desired system input signals, since the RF control signal is not subjected to multipath impairments and typically can be properly demodulated even if it has a low input signal-to-noise ratio (such as 30 dB for most digital signal modulation formats). A low level control signal ensures low intermodulation distortion in the transmit signal, which may be caused by the control signal itself.

After demodulation of the control signal, if necessary, control signal demodulator 46 further processes the analog or digital control signal to be in correct format to be able to alter the setting of gain control amplifier 34'.

Figure 4:
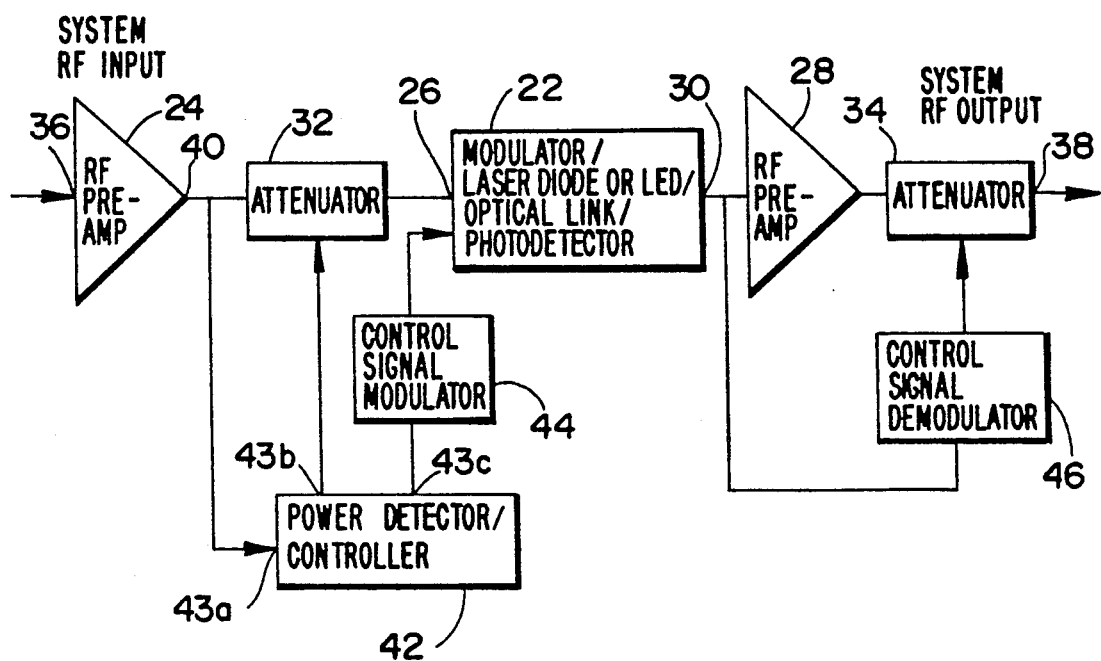
FIG. 4 is a block diagram illustrating a third embodiment of the present invention, wherein a control signal for effecting control of the second signal level changing means is transmitted over the optical link.

A third embodiment of the dynamic range enhancing system of the present invention, as shown in FIG. 4, similarly includes a control signal modulator 44 and control signal demodulator 46, and operates in substantially the same way as described above with respect to the second embodiment depicted in FIG. 3. The basic difference between these embodiments is that, in the third embodiment, first and second signal level changing devices 32, 34 are variable programmable attenuators, as in the first embodiment, and a second preamplifier 28 is also provided, as in the first embodiment.

The use of programmable gain control amplifiers for the first and second signal level changing devices, can be advantageous insofar as the functions of a preamplifier and variable attenuator may be combined into one active element. Programmable RF gain control amplifiers contain one or more gain control elements, such as amplifier stages with various variable control active devices. An example of one such gain control element is a dual-gate FET.

The basic operation of the embodiment of FIG. 3 is similar to that of the FIGS. 2 and 4 embodiments. As control device 42 detects the instantaneous composite power at the output of preamplifier 24', control device 42 generates two control signals which are intended to set the gain levels of gain control amplifiers 32' and 34'. If the initial output of preamplifier 24' is extremely low and is below a preset first input power threshold, control device 42 sets the gain of control gain amplifier 32' to a given high value and simultaneously sets the gain of gain control amplifier 34' to a given low value (typically near the low end of its control range).

If the system RF input system power, as detected by control device 42, increases only slightly, the gain settings of gain control amplifiers 32' and 34' remain fixed at their present existing gain values. But if the RF input power detected by control device 42 were to (slowly) continuously rise (due to a continual increase in system RF input power) above the predetermined first threshold, control device 42 will adjust the gain level of gain control amplifier 32' to a lower gain value than its previous setting, based on the maximum value of power which should be present at input 26 of transmission link 22, which, in this case, is the input of a laser or light-emitting diode modulator of an optical link within transmission link 22.

For every one dB increase of system RF input power at system input 36, the gain setting of gain control amplifier 32' decreases by one dB. Concurrently or almost simultaneously, control device 42 generates a control signal at output 43c to set gain control amplifier 34' to a higher level of gain than set previously, the change in gain of gain control amplifier 34' being the same as the change set for gain control amplifier 32'. For every 1 dB increase of system RF input power at system input 36, the gain setting of gain control amplifier 34' increases by 1 dB.

As gain control amplifier 32' and gain control amplifier 34' simultaneously respond by changing their respective RF gain levels equally, in opposite directions, the net system gain between system input 36 and system output 38 remains constant. As the system input power level at system input 36 rises, the RF system power at input 26 of transmission link 22 remains nearly constant.

If the power at preamplifier output 40' as detected by control device 42, is above the first threshold, control device 42 calculates the amount by which the power detected at output 40' of preamplifier 24' exceeds the predetermined threshold. If, for example, the power detected is 5 dB above the threshold, control device 42 decreases the gain setting of gain control amplifier 32' by 5 dB below its given zero input power, and simultaneously or concurrently increases the gain setting of gain control amplifier 34' by 5 dB above its given zero input power setting.

In this embodiment, as is the case for the first embodiment, extreme accuracy for the power detecting function of control device 42 is not required for most applications. Also, the settings of the gain control amplifiers need not be extremely precise. For some applications, a 2 dB accuracy for the detector and a 0.5 dB accuracy for the programmable gain control amplifiers will be adequate.

If the system RF input power level at preamplified output 40' continually rises past the point (i.e., a second threshold value) where second gain control amplifier 34' has already been set to its maximum gain, control device 42 may optionally be programmed to set gain control amplifier 34' at the maximum gain end of its adjustment range, and to continue to meanwhile decrease the gain of gain control amplifier 32' by 1 dB for each 1 dB increase of system RF power level. In this mode, control device 42 continues to compensate for increasing input power until gain control amplifier 32' reaches its minimum gain setting, thereby resulting in both gain control amplifiers 32' and 34' being set to constant amplification levels. The point at which control amplifier 32' reaches its minimum gain setting is when the system RF input power level reaches a third threshold value.

Thus, it can be seen that, where the signal level changing devices comprise gain control amplifiers 32' and 34' rather than variable attenuators 32 and 34, the signal level changing devices are still controlled based upon first, second, and third threshold values of the system RF input power level. When the input power level is below a first threshold, both signal level changing devices (32, 34/32', 34') are set to constant attenuation or gain levels. When the input power level is between the first threshold and a second threshold, the first signal level changing device (whether it is an attenuator or amplifier) is set to decrease the relative power level of the transmit signal present at input 26 of transmission link 22, and the second signal level changing device (attenuator or amplifier) is set to decrease the signal level present at system output 38. When the input power level is between second and third thresholds, only the first signal level changing device is active (i.e., changes its setting to compensate for a change in input signal level). When the input power level is above the third threshold, neither signal level changing device is active (i.e., adjustable to affect the signal level).

For certain applications, the programmable gain control amplifier of the second embodiment may require the use of programmable gain amplifiers with: low AM/PM conversion; high linearity at various gain settings; very stable RF gain versus control voltage or control current characteristics, as a function of time and temperature; and/or low noise figure at various gain settings. Thus, selection of a particular amplifier will likely depend upon the characteristics needed for a given application.

Compared to systems incorporating AGC amplifiers with feedback, tandem fiber optic cable or free-space optical link systems employing the second embodiment of the invention described herein may be expected to not exhibit uncontrolled, undesired or oscillatory behavior when the tandem system is driven by an input transient. This phenomenon, regarding the behavior of tandem AGC amplifiers with feedback, is described in Chisholm, E. W., "Consideration of Applications on the AGC/ASC amplifiers and CATV systems," *IEEE Transactions on Cable Television*, Vol. CATV-1, No. 1, October 1976, pages 40-61.

Figure 5:
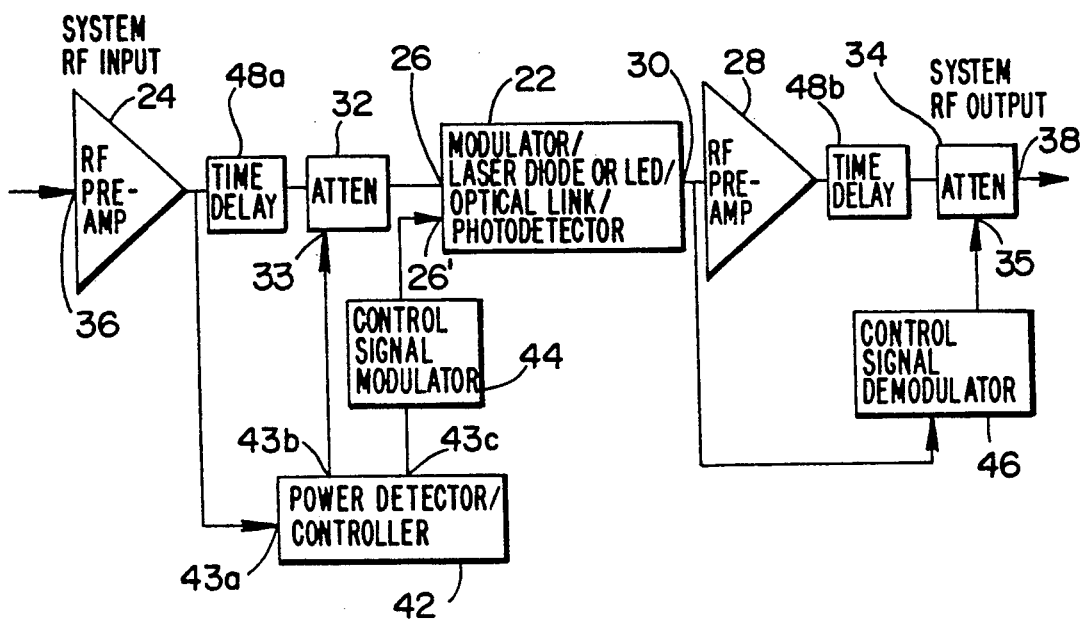
FIG. 5 is a block diagram illustrating a fourth embodiment of the present invention, wherein time delay circuits are utilized to compensate for system delays.

A fourth embodiment of the dynamic range enhancing system of the present invention is shown in FIG. 5. In the fourth embodiment, elements similar to those of the system of FIG. 4 are represented by the same reference numerals.

Transmission link 22 has, connected at its input 26, preamplifier 24, time delay circuit 48a, and first signal level changing device 32, all respectively connected in cascade. Transmission link 22 also has, connected at its output 30, second preamplifier 28, time delay circuit 48b, and second signal level changing device 34, all respectively connected in cascade. Further, in a fashion similar to the system shown in FIG. 4, the dynamic range enhancing system of the fourth embodiment also comprises control device 42, control signal modulator 44, and control signal demodulator 46. First output 43b of control device 42 is connected to programmable input 33 of first signal level changing device (attenuator) 32. Control signal modulator 44 is connected at its input to second output 43c of control device 42, and is connected at its output to input 26' of transmission link 22. Corresponding control signal demodulator 46 is placed between output 30 of transmission link 22 and the programmable input 35 of second attenuator 34.

A significant characteristic of the fourth embodiment, shown in FIG. 5, is the provision of fixed time delay networks 48a and 48b which are respectively placed in series with first signal level changing device 32 and second signal level changing device 34. For applications requiring a demanding degree of transient response and/or response speed, these fixed time delay networks serve to compensate for time delays inherent in control device 42, control signal modulator 44, and control signal demodulator 46. It is noted that utilization of these time delay networks (which may comprise conventional time delay circuits) is optional, and further that either one or the other of the time delay networks 48a and 48b may be utilized alone to achieve a beneficial result, depending on the particular application and use of the system, and the desired results of the same.

It is further noted that attenuators 32 and 34 are preferably controlled by a digital input signal, and that the setting of a given attenuator will remain fixed for an indefinite period until altered by a newly administered digital command from control device 42. This feature may be applied to any of the embodiments of the present invention to reduce the requirement for frequent updates of attenuator settings, and dramatically reduce the necessary information rate and bandwidth requirements for control signal modulator 44 and control signal demodulator 46, which may be required for many applications.

The required bandwidths of control signal modulator 44 and control signal demodulator 46 depend upon the maximum rates of change for the attenuation value of second signal level changing device 34 which may be required for a given application. For example, if a digital control signal were utilized and a six bit (per digital command) control signal were assumed (providing 64 discrete levels of attenuation, with almost 16 dB total range, and 0.25 dB attenuation steps), and the desired rate of change of the attenuator is assumed to be 16 dB in 0.1 seconds, the feedforward control system bandwidth would have to support 64 steps per 0.1 seconds or about 3,640 bits per second information rate, without including any data overhead requirements.

In another aspect of the present invention, a setting process provides control instructions to increase the dynamic range of a transmission link. In one embodiment of the setting process, a number of process steps are performed to define a number of instructions to be carried out by control device 42 of the dynamic range enhancing system of the present invention. In other words, the set of instructions and/or steps to be carried out by control device 42 of the dynamic range enhancing system (illustrated in FIG. 2) are determined according to a process forming part of the present invention.

This process may be carried out in a number of different forms which are within the capabilities of those skilled in the art. For example, control device 42 may be provided with a microprocessor designed to perform the steps of the process in cooperation with a memory which stores the process steps of the setting process and also stores resulting instructions determined as a result of implementation of the setting process. On the other hand, a separate and independent processing apparatus having a microprocessor and memory may be provided to generate setting instructions to be carried out by control device 42. In this case, the results (i.e., the instructions for control device 42) determined by the separate processor may either be manually input in the form of instructions, by use of an interface connected to control device 42, or alternatively a system may be provided to allow automatic communication between the separate processor and control device 42. The resulting instructions which allow setting of control device 42 of the dynamic range enhancing system to "instruct" the dynamic range enhancing system in such a way to control first and second signal level changing devices 32, 34 to provide the best possible dynamic range for a given application. One particular embodiment of this process will now be described with reference to FIG. 13.

Figure 13:
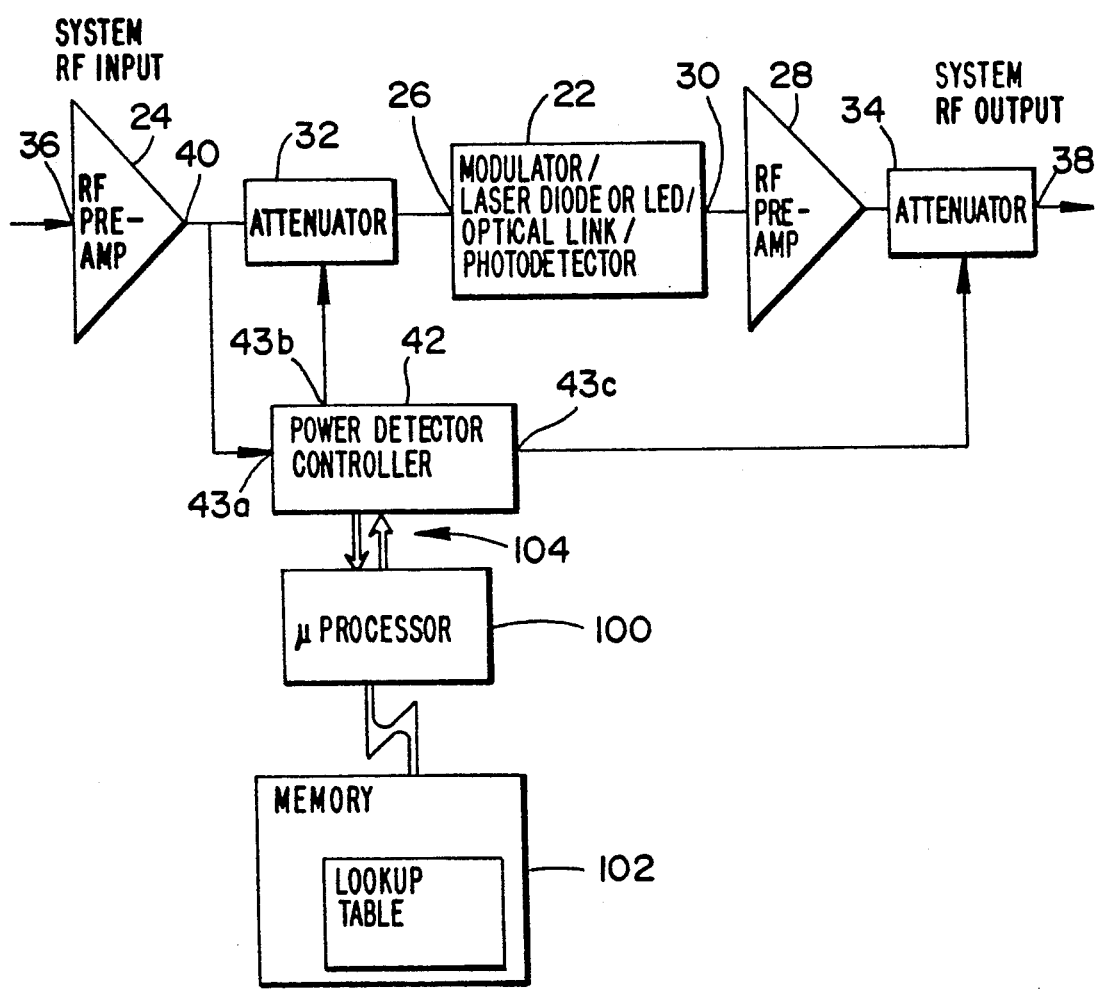
FIG. 13 is a block diagram illustrating a tenth embodiment of the dynamic range enhancing system of the present invention, wherein a microprocessor and memory lookup table are provided.

FIG. 13 shows a block diagram illustrating a dynamic range enhancing system, as in the first embodiment shown in FIG. 2, together with a microprocessor 100 and memory 102 coupled to control device 42 by means of an interface 104. It is noted that interface 104 may be permanently installed to provide communication with another microprocessor provided in control device 42; or, in the alternative, a detachable input/output interface may be provided so that a portable unit having a microprocessor and memory capable of performing the setting process of the present invention may be carried to a remote site at which control device 42 of the dynamic range enhancing system is located. In such a case, maintenance personnel may travel to any location in which control device 42 is located, and may appropriately set the instructions of control device 42 for controlling first and second signal level changing devices 32, 34 to accommodate any change in the type of input signals being received at the input of the system.

In another alternative configuration of a system which may be provided to carry out the steps of the setting process of the present invention, control device 42 may, in and of itself, comprise a microprocessor and memory which not only carries out the instructions stored therein, but also is configured to set the instructions to be carried out in accordance with the particular application at hand, which is typically a function of the type of modulation employed for input signals at system input 36.

In the setting process of the present invention, according to one particular embodiment (specifically referring to FIG. 13), a table of values is created by microprocessor 100 in conjunction with memory 102 to form a look-up table of values to be stored in memory 102. A set of control instructions for control device 42 may be defined by microprocessor 100 as a function of the number of high level signals present at the system input or by an approximation representing the number of high level signals. After being set by microprocessor 100, control device 42 comprises the necessary instructions to properly control first and second signal level changing devices 32, 34 as a function of certain characteristics of the transmit signal input into the system, one characteristic being the composite power of the input signal. The set of instructions defined by microprocessor 100 tells control device 42 which of the characteristics of the input transmit signal are to be taken into account in controlling first and second signal level changing devices 32, 34, and microprocessor 100 also tells control device 42 how to determine those characteristics.

The following explanation describes the analysis behind the setting process of the present invention by way of particular example, which is not limiting, and which is intended only to illustrate the methodology for defining instructions to set control device 42. First, it is assumed that a certain variable number of equal-level input signals (e.g., 2, 3, 4, 5 and 8) represents typical combinations of signals present at signal input 36, implying that all other input signals are insignificant (again, for this example). Further, it is assumed that the laser diode or light-emitting diode in transmission link 22 is the dominant intermodulation source of the system. An input third-order intercept of +27 dBm for the optical diode modulator is assumed. For cases where three or more input signals are present, it is assumed that the third-order intermodulation product of interest is a three-tone product, since it is typically 6 dB above the level of the two-tone product. Also, it is assumed that only one three-tone product falls into a particular radio channel of interest at a time. If it had been assumed that more than one three-tone product became a co-channel interfering signal, the resulting algorithm would be different.

In addition, for the analysis implemented in this example in arriving at the instructions for control device 42, a fixed intermodulation ratio of 77 dB is assumed for a two-tone third-order product with two input tones, and a fixed intermodulation ratio of 77 dB is assumed for the three-tone product with 3, 4, 5, or 8 tones. The analysis shows that the composite level at the laser or light-emitting diode modulator input 26 for a fixed intermodulation ratio of 77 dB as a function of the number of equal-level input signals would be:

| Number of Signals | Total Input to Diode Modulator |
|---|---|
| 2 | −8.5 dBm |
| 3 | −9.7 dBm |
| 4 | −8.5 dBm |
| 5 | −7.5 dBm |
| 8 | −2.5 dBm |

These input-to-diode modulator composite power level values are effective values which relate to the intermodulation third-order products which would result at the system input 38 as a result of the intermodulation distortion caused by the laser diode or light-emitting diode of the transmission link.

Thus, from this analysis it can be concluded that for between one and five equal-level system input signals, a straightforward composite (average total) power measurement may be utilized to determine the proper settings for first signal level changing device 32 and second signal level changing device 34.

Figure 6:
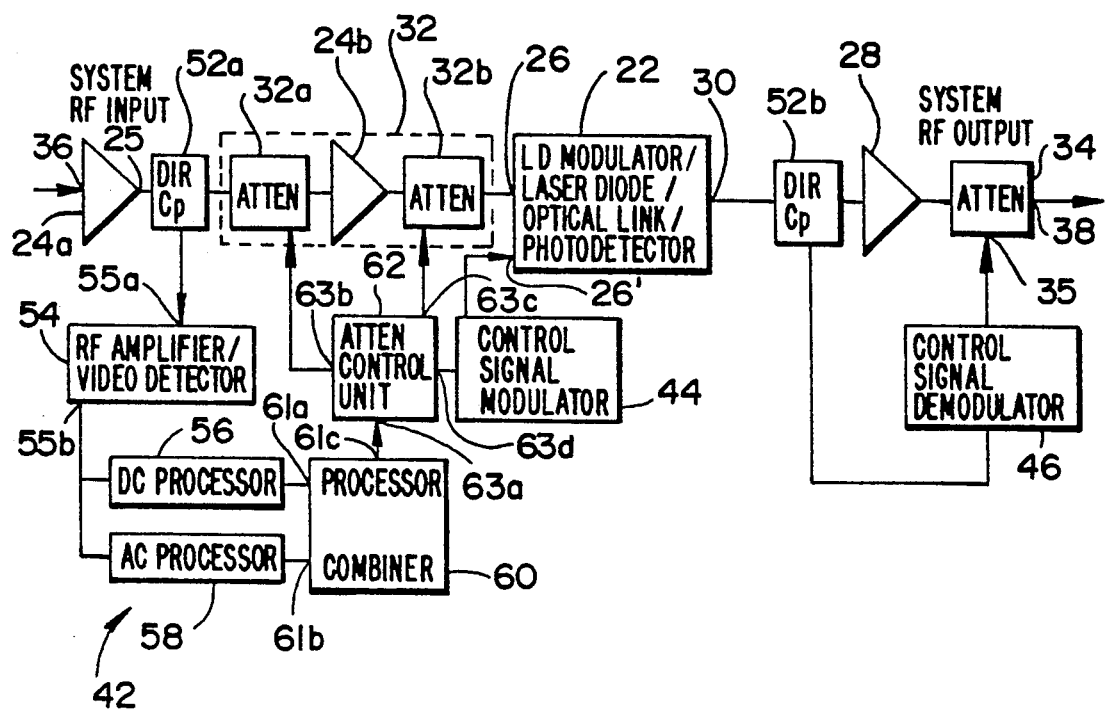
FIG. 6 is a block diagram illustrating a fifth embodiment of the dynamic range enhancing system of the present invention, which system includes a specifically defined control device.

For a larger number of dominant signals, that is, for a number greater than five input signals, a complex signal processing technique (such as one employing an AC processor and combiner device described infra; see FIG. 6) might need to be employed, in the event a 6 dB error were found to be unacceptable for a given application.

The look-up table with input signal composite power values and other values based on the AC characteristics of the detected signal would be used to determine the instantaneous attenuation or gain settings of the first and second signal level changing devices.

A fifth embodiment of the dynamic range enhancing system of the present invention will now be described with reference to FIG. 6.

In comparison to the previously-discussed embodiment of the present invention it can be seen that the pre-transmission section of the dynamic range enhancing system, which consisted of a preamplifier 24 and a first signal level changing device 32, has been replaced by a tandem combination of preamplifier 24a, directional coupler 52a, attenuator 32a, preamplifier 24b, and attenuator 32b. Further, in the fifth embodiment, control device 42 has been reconfigured to include directional coupler 52a, monitor device 54, DC processor 56, AC processor 58, combining unit 60, and attenuator control unit 62. Further, a second directional coupler 52b is placed between transmission link 22 and preamplifier 28.

Monitor device 54, which in this embodiment comprises an RF amplifier and video detector, is connected at its input 55a to directional coupler 52a to thereby sample the signal amplified by preamplifier 24a. Output 55b of monitor device 54 is connected to respective inputs of DC processor 56 and AC processor 58, the outputs of which are then connected to two respective inputs 61a, 61b of combining unit 60. Output 61c of combining unit 60 is connected to input 63a of attenuator control unit 62. Attenuator control unit 62 further comprises three outputs, 63b, 63c and 63d. Output 63b is connected to the programmable input of attenuator 32a; output 63c is connected to the programmable input of attenuator 32b; and output 63d is input to control signal modulator 44, the output of which is connected to control signal input 26' of transmission link 22.

Directional coupler 52a, connected to the output of preamplifier 24a, feeds a sample of an amplified input transmit signal to monitor device 54, which in turn provides a video signal having a bandwidth typically greater than 1 MHz and a spectral position that corresponds with a direct-current carrier. This video signal is in turn further processed by DC processor 56, as well as concurrently processed by AC processor 58. DC processor 56 provides a measurement signal indicative of the instantaneous composite (total average) RF level which is present at output 25 of preamplifier 24a. In the meantime, AC processor 58 provides a measurement signal indicative of the second-order intermodulation products generated in the rectification process at the output of monitor device 54.

One preferred input power threshold setting for the system of the embodiment shown in FIG. 6 is −45.5 dBm. Thus, for composite input power levels below −45.5 dBm, the setting of each respective variable attenuator, 32a, 32b and 34, would remain fixed. However, for input power levels above −45.5 dBm, the settings of both signal level changing devices (i.e., of variable attenuators 32a, 32b, and 34) would change accordingly as previously described with respect to FIG. 2.

AC processor 58 detects the AC component present at output 55b of monitor device 54. If, for example, two signals at −48.5 dBm each were connected to system input 36, spaced apart from each other in the frequency domain by a frequency of 210 kHz, the output of monitor device 54 would contain a DC level indicating the total RF input power of the two input signals present at input 36, and an AC signal with a frequency of 210 kHz, equal to the difference frequency (as well as many harmonics of 210 kHz). If, instead, only one signal at −45.5 dBm were connected to system input 36, output 55b of monitor device 54 would contain a DC level indicating the same total power as for the previous case, but no low frequency AC signal would be present.

An analysis of the third-order intermodulation product levels at output 30 of transmission link 22, as a function of the total number of equi-level input fundamental signals, was discussed above with respect to the setting process for providing instructions to control device 42 shown in FIG. 13, which has been functionally replaced in FIG. 6 by monitor device 54, DC processor 56, AC processor 58, combiner 60, and attenuator control unit 62; and the analysis shows that the correct process for driving attenuators 32a and 32b would be such that for one through five input signals, a composite (total) power level of −35.5 dBm at output 30 of transmission link 22, corresponding to an effective −8.5 dBm at input 26 of transmission link 22, can be expected to give acceptable intermodulation performance over a wide range of input signal levels.

When eight equal level signals are present at input 36 of the system, a correct process for driving the first two attenuators 32a and 32b would be such that a composite power level of −29.5 dBm at output 30 of transmission link 22, corresponding to an effective −2.5 dBm at input 26 of transmission link 22, can be expected to give acceptable intermodulation performance over a wide range of input signal levels. This analysis therefore shows that for optimal operation of attenatuator control unit 62, the role of AC processor 58, for input power levels present at input 36 which are above −41.5 dBm total, should be to reduce the attenuation settings of attenuators 32a and 32b slightly and to increase the attenuation setting of attenuator 34 slightly (beyond that normally suggested based only upon the output of DC processor 56), if there is evidence that a large number of high-level signals are present. Such evidence may be provided to combiner 60 by AC processor 58.

For this application, as long as fewer than six higher-level signals are present at input 36 (as evidenced by the output of AC processor 58), the output of DC processor 56, which is proportional to the composite input power level, would alone be used by combiner 60 to determine the correct setting of the attenuators as set by attenuator control unit 62.

By way of example, AC processor 58 provides a DC output proportional to the peak AC voltage present at its input. AC processor 58 may also potentially involve weighing of certain frequencies in the video range from 30 kHz to 10 MHz, such as might be provided by a pre-emphasis function in AC processor 58 for certain applications. Weighing of AC processor 58 and DC processor 56 by combining unit 60 is set as a function of the particular application at hand.

The outputs of AC and DC processors 56, 58 are in turn combined by processor combiner 60, which also optionally applies attack and decay time constants and scaling of the AC and DC processor outputs. As mentioned previously, the speed of the feed forward control function of the overall system may be adjusted to suit the particular application. For the micro-cell antenna remoting application, the feed forward control attack time would likely need to be 10 to 100 msec (milliseconds); and a decay time of 20 to 200 msec would likely be acceptable. If the attack period is too long or the decay period is too short, a nearby vehicular TDMA terminal could disrupt a micro-cell portable terminal user call, because of the intermittent nature of the TDMA terminal transmission.

Output 61c of combining unit 60 is then fed to attenuator control unit 62. The function of attenuator control unit 62 is to generate analog or digital control signals for attenuators 32a, 32b and 34, based on the instantaneous DC level of a control signal provided to it by combining unit 60. The correct control signals are determined according to an application-dependent algorithm (i.e., the setting process of the present invention) which is intended to maintain a maximum composite power level of approximately −8.5 dBm at input 26 of transmission link 22. The previous discussion of the function of DC processor 56, AC processor 58 and combiner 60, in which the inputs to combiner 60 and the output of combiner 60 were DC signals, is not intended to preclude those signals form being analog AC or digital signals, but was only intended to explain one particular embodiment of the present invention.

With respect to FIG. 13 and the setting process of the present invention, and also FIG. 6 and the fifth embodiment shown in FIG. 6, the specific operation of both to these embodiments of the present invention will now be described in more detail, by way of example.

Referring to the setting process, and FIG. 13, a look-up table for setting instructions in its simplest implementation would have two columns, one column listing "power" values and the other listing "attenuation or gain" values. That is, based on the measured power of the transmit signal, a particular value of attenuation or gain for each of the variable signal level changing devices would be indicated in the form of a table. In this approach, no AC processor would be provided, thus resulting in less cost and complexity. The value of attenuation or gain to be set for each of the signal level changing devices depends only on one piece of information, the input signal power level provided by a DC processor.

When both AC and DC processors are provided to effect the desired settings for the signal level changing devices, such as shown in the embodiment of FIG. 6, combining unit (or processor) 60 may be provided with a look-up table having a plurality of variables arranged in three or more columns, where the value of attenuation or gain of each of the signal level changing devices would depend on two or more separate pieces of information. These separate pieces of information are provided by the AC and DC processors, respectively. Depending on the application, several separate pieces of information could be generated by AC processor 58, and the value of the setting for each attenatuator or gain-control amplifier would depend on all available pieces of information, that is, the settings would depend on the RMS input power level determined by DC processor 56 and also on any information provided by AC processor 58.

Referring to FIG. 6, monitor device 54 samples the transmit signal at the system input and rectifies the transmit signal, resulting in a broad band video signal having both DC and AC components, DC processor 56, in simplest form, comprises a fixed low pass filter with a certain amount of attenuation associated therewith.

Figure 6A:
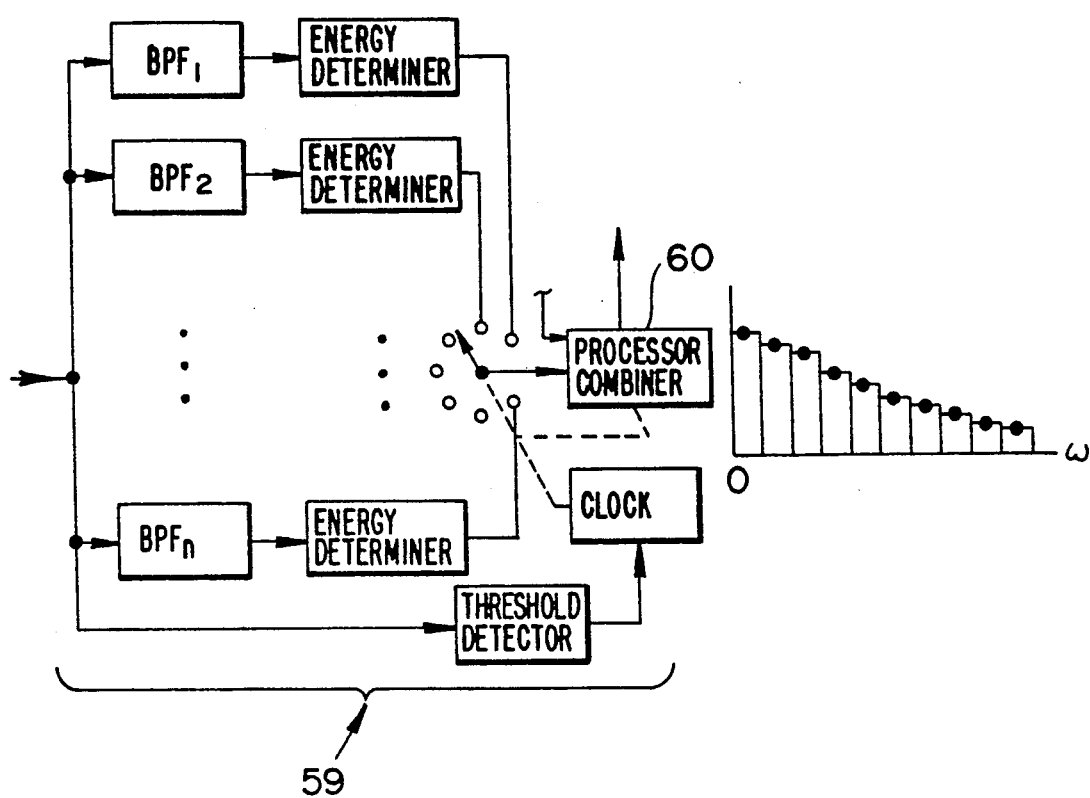
FIG. 6a is a block diagram illustrating a multi-channel spectral analyzer used in conjunction with a particular aspect of the fifth embodiment of the present invention.

AC processor 58 may be implemented as shown in FIG. 6a, which illustrates a multi-channel spectral analyzer 59 connected to an input of combining device 60. Monitor device 54, processes a replica of the system input signal, and generates low frequency AC difference products (in the frequency domain) which are in turn fed into AC processor 58. Utilizing a low-cost implementation, the AC processor is capable of measuring the energy level of low-frequency signals at the output of monitor device 54 in a certain limited number of (e.g., three) frequency bands. Each of these individual power levels, along with the measured average (RMS) input power as determined by DC processor 56, are monitored by combining unit 60 which calculates, based on all of these values, the correct level of attenuation or gain to be set for the first and second level signal changing devices of the present invention.

Thus, it can be seen that combiner 60 assimilates all information input thereto and forms output signals which are sent to attenuation control unit 62 to control the respective settings of the first and second signal level changing devices.

In accordance with a specific implementation, combining unit 60 comprises a microprocessor and memory, wherein a plurality of variables having certain values are stored. These variables may be stored in the memory to form two distinct look-up tables, Table No. 1 and Table No. 2. Table No. 1 comprises information relating to the information output by AC processor 58, and Table No. 2 provides information relating to the output from DC processor 56. Particularly, Table No. 2 has two columns, one column representing a number of input power levels represented in root mean square (RMS) power values, and the other column representing the desired signal level at the output of each of the first and second signal level changing devices (which may be translated to either an attenuation or amplification value). In this regard, for the embodiment shown in FIG. 6, three signal level values would be specified in each row of the second column comprising a first signal level value for attenuator 32a, a second signal level value for attenuator 32b, and a third signal level value for attenuator 34. Table No. 1 may be simplified for the purpose of explanation as follows:

| B1 | B2 | B3 | |
|----|----|----|---|
| 0  | 0  | 0  | $\delta_1 = 0$ |
| 5  | 5  | 5  | $\delta_2$ = a small amount (e.g., three dB) |
| 10 | 10 | 10 | $\delta_3$ = a large amount (e.g., six dB) |

In this table, three distinct energy levels of each of three bands B1, B2 and B3 are specified. The location of these frequency bands may be, for example, 10 kHz to 100 kHz for band B1, 100 kHz to 1 MHz for band B2, and 1 MHz to 10 for band B3. As previously discussed, when greater than five high level input signals are present at the system input 36, it is preferable that the magnitude of the transmit signal going over transmission link 22 be slightly increased as compared to when five or less high level input signals are present at system input 36. Thus, frequency bands B1, B2 and B3, as separated by AC processor 58, represent an approximation of the number of high level input signals present at system input 36.

The respective settings of the first and second signal level changing devices may be represented as follows:

$$SD_{1DC} + \delta$$

$$S_{2DC} - \delta,$$

where $SD_{1DC} + \delta$ represents the desired signal level present at the output of the first signal level changing device and $S_{2DC} - \delta$ represents the desired signal level present at the output of the second signal level changing device. $S_{1DC}$ represents the desired signal level present at the output of the first signal level changing device determined by combiner 60, solely as a function of the RMS input power level calculated by DC processor 56; and $S_{2DC}$ represents the desired signal level present at the output of the second signal level changing device, also solely as a function of the RMS power level as determined by the DC processor 56. $\delta$ represents the component, or change in signal level which is effected by the output of AC processor 58.

Table No. 1 is used in order to determine the respective $\delta$ value depending on the number of high level signals present at the system input 36 as determined by an approximation performed by AC processor 58. Table No. 2 simply sets forth the $S_{1DC}$ and $S_{2DC}$ values which are associated with certain RMS values as determined by DC processor 56. As can be seen by the above Table No. 1, if no low frequency AC components are detected within each of the bands B1, B2 and B3, then $\delta$ would be assigned the value of 61 which is equal to zero. However, if a mid-value energy level of five units were detected within each of the frequency bands B1, B2 and B3, $\delta$ would be assigned the value of $\delta_2$ which is equal to a small amount (e.g., 3 dB) On the other hand, if high level signals are present within frequency bands B1, B2 and B3, represented by magnitudes of 10 in each band, $\delta$ would be assigned a value of $\delta_s$ which would be the largest amount of $\delta$ (e.g., 6 dB).

Table No. 1 depicted above may be set up with a significantly larger number of values having $\delta$ values ($\delta_1 \ldots \delta_n$) corresponding to many possible combinations of energy levels for the respective frequency bands.

Accordingly, where the number of high level signals present at signal input level 36 are less than a preset number, $\delta$ would be set to be equal to $\delta_1 = 0$ by combiner 60, and the output of AC processor 58 would essentially have no effect on the control of both signal level changing devices. However, if more than a preset number of high level signals are present at input 36, bands B1, B2, and B3 will likely have certain relatively high energy levels, and combiner 60 would assign $\delta$ to have a certain value $\delta_k$, which will be added to the signal level present at the output of the first signal level changing device and will be subtracted from the signal level present at the output of the second signal level changing device.

Figure 14:
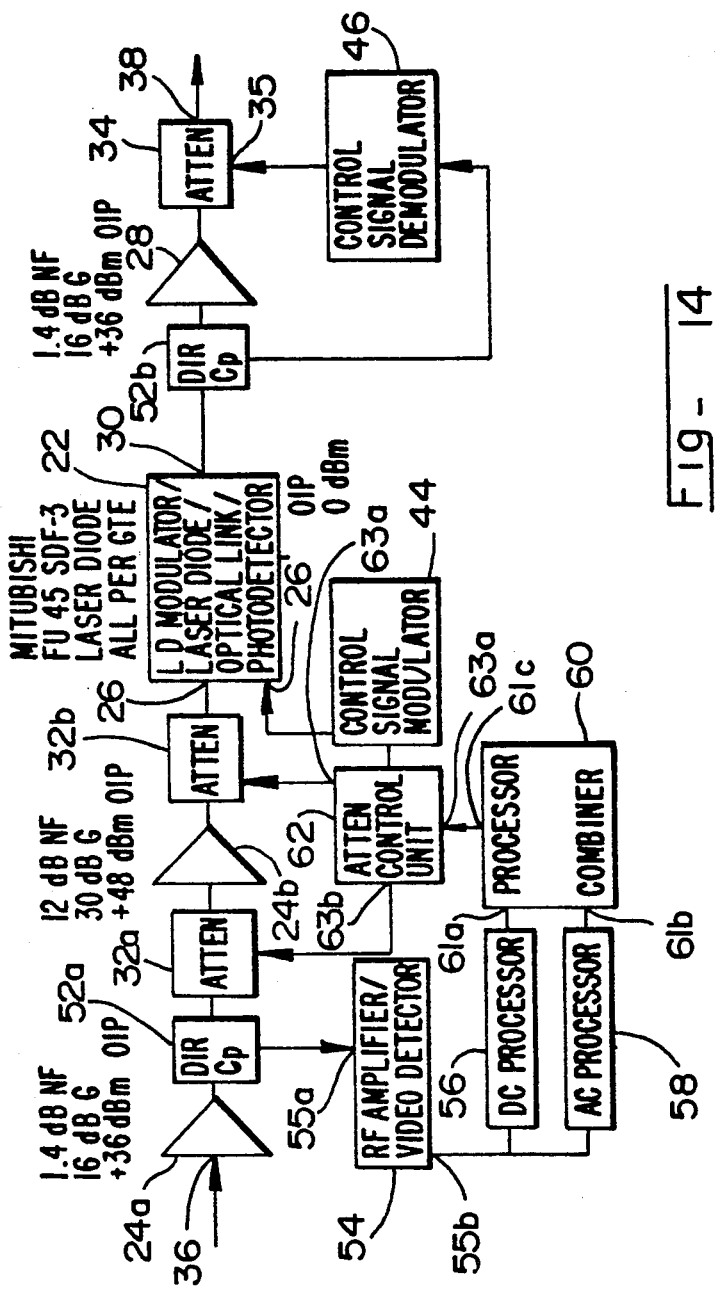
FIG. 14 is a block diagram of a particular version of the system shown in FIG. 6.

FIG. 14 depicts a more specific version of the fifth embodiment shown in FIG. 6, with a number of particularly specified components similar to those utilized by GTE as discussed by Fye, D. M., in "Design of Fiber Optic Antenna Remoting Links for Cellular Radio Applications" (previously cited). This version of the fifth embodiment of the present invention illustrates the enhanced overall dynamic range capability of the invention by analysis of the third-order intermodulation and noise figure properties thereof.

It is noted that an example of possible RF amplifier and attenuator devices which could be utilized in this version of the fifth embodiment are all manufactured by Janel Laboratories. They include:

Preamplifiers 24a and 28: PF845D, 1.4 dB noise figure, 16 dB gain, +36 dBm output third-order intercept.

Attenuators 32a, 32b and 34: AT883, +60 dBm input third-order intercept at 2 dB attenuation, +55 dBm input third-order intercept at 10 dB attenuation.

Preamplifier 24b: PA3101; 12 dB noise figure, 30 dB gain, +48 dBm output third-order intercept (assumed since this unit covers 900–920 MHz; the same specifications would apply for a unit to cover 821–851 MHz).

Transmission link 22 having laser diode, fiber optic cable and connectors, and photodetector: Assumed to have the same characteristics as those shown in the published article by Fye, D. M., entitled "Design of Fiber Optic Antenna Remoting Links for Cellular Radio Applications," as presented by GTE (Mitsubishi FU 45SDF-3 was the laser diode utilized by GTE).

Of course, the present invention is not limited to these specific components, which are being given herein by way of example only.

Figure 15:
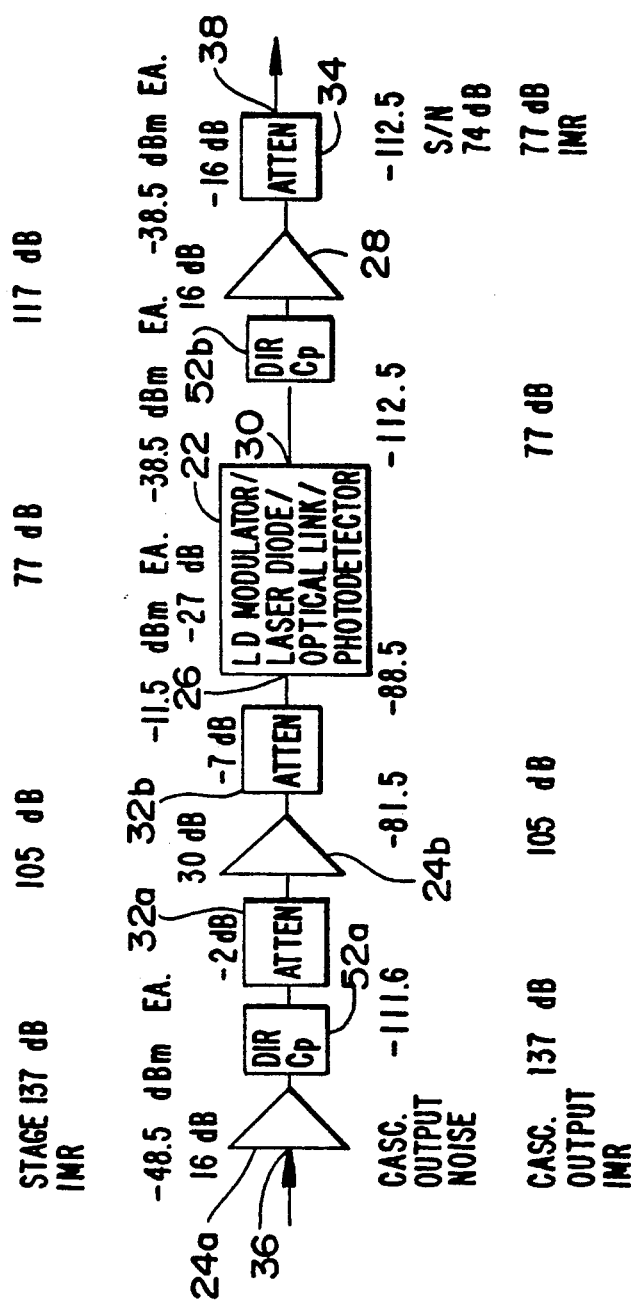
FIG. 15 is a block diagram illustrating one predicted operation of the system depicted in FIG. 14, for two input signals of −48.5 dBm each.

FIG. 15 shows one predicted operation of the specific version of the present invention shown in FIG. 14, wherein a first pair of input signals of $-48.5$ dBm each is provided at system input 36. The predetermined system input power threshold of this embodiment is −45.5 dBm, equivalent to the total power of two equal level signals at −48.5 dBm each. If two signals at −48.5 dBm each were connected to input 36 of preamplifier 24a, attenuator control units 62 would set attenuator 32a for 2 dB attenuation and attenuator 32b for 7 dB attenuation.

Figure 16:
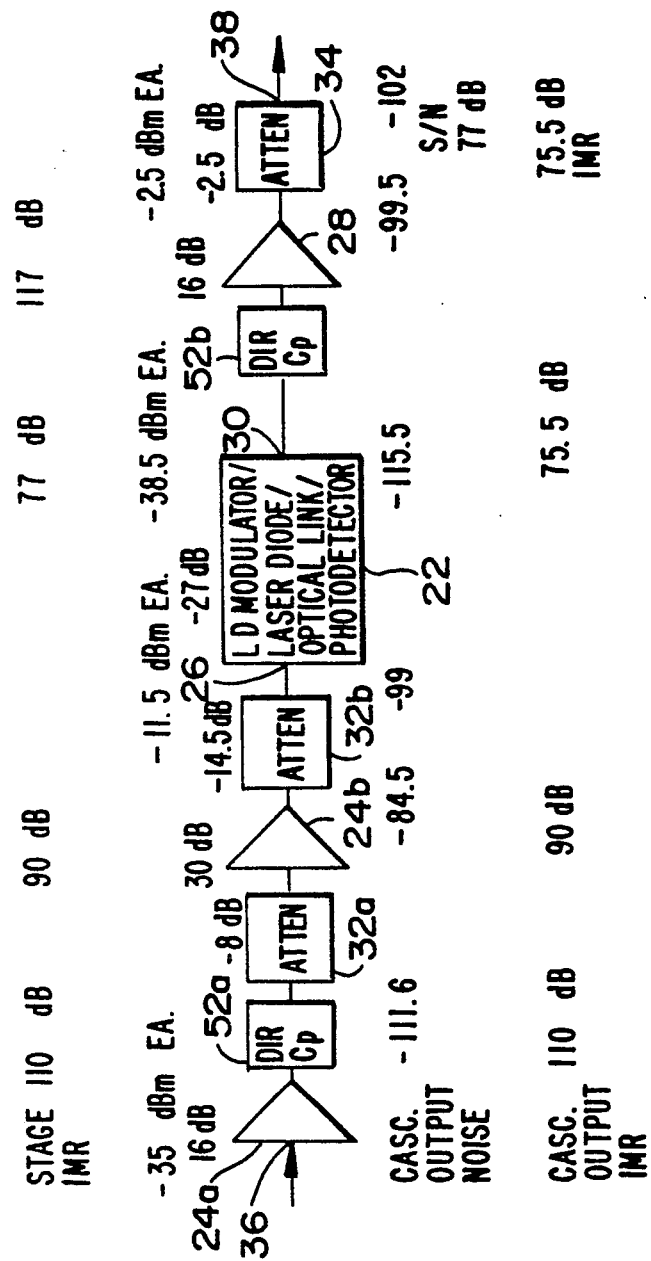
FIG. 16 is a block diagram illustrating a predicted operation of the system depicted in FIG. 14, with two input signals of −35 dBm each.

The predicted operation of this specific version of the present invention can be further analyzed for a second pair of input signal levels, as shown in FIG. 16. If instead, two signals at −35 dBm each were connected to input 36 of preamplifier 24a, attenuator control unit 62 would automatically set attenuator 32a to 8 dB attenuation and attenuator 32b to 14.5 dB attenuation. These settings would ensure that the signal level at the output of attenuator 32b would be −11.5 dBm per signal for both examples (i.e., for the examples shown in both FIGS. 15 and 16). For the 13.5 dB higher level input signals of the case in FIG. 16, the total attenuation change for attenuators 32a and 32b was 13.5 dB. In the event two signals lower than −48.5 dBm each were connected to input 36 of the system, attenuation control unit 62 would set attenuators 32a and 32b to the same settings as for the −48.5 dBm per signal case, which was shown in FIG. 15.

As explained previously, the attenuator settings are formulated to avoid over-driving the laser or light-emitting diode of transmission link 22 in order to help control third-order intermodulation products, in the event that a high-level signal is injected at input 36 of preamplifier 24a. With the feed forward attenuator control function of the present invention, as shown in the configuration in FIG. 14, the overall dynamic range would be dramatically enhanced, as compared to the example presented previously of an antenna remoting system employing a fixed-gain preamplifier.

The configuration shown in FIG. 14 also maintains a fixed gain over the link from end to end (that is, from system input 36 to system output 38) by employing gain compensation at the distant end under feed forward control. Attenuator control unit 62 provides an analog or digital control signal which is used to control attenuator 34. The RF output of attenuator 34, that is, the system RF output at system output 38, is in turn connected to a receiver multicoupler of a cellular communication system.

The operation of attenuator 34, that is, the attenuator which is located at the post-transmission side of transmission link 22, will now be described by way of the following examples. Considering again the case shown in FIG. 15, where the input signal consisted of two low level signals at −48.5 dBm each, attenuator 34 will be set to 16 dB attenuation. For the case shown in FIG. 16, where the input signals were increased by 13.5 dB to be −35 dBm each, the settings of attenuators 32a and 32b were also increased by a total of 13.5 dB. Therefore, in order to maintain a zero net gain change over the link, attenuator control unit 62 simultaneously generates a signal which is used to control attenuator 34, thus reducing its attenuation level by 13.5 dB to −2.5 dB.

The result of employing three preamplifiers and three attenuators controlled by a feed forward control system is that, while an antenna remoting link using a fixed gain preamplifier in a system described by GTE had a usable input signal range of 77 dB, the embodiment of the present invention employing a feed forward control link as described herein has a usable system input signal range of more than 90 dB. Also, for the GTE antenna remoting system, in which two input signals at −35 dBm each were assumed, the output third-order intermodulation products were only 50 dB down from the fundamental signals. For the system described herein having an assumed input of two input signals at −35 dBm each, the output two-tone third-order intermodulation products would be 75.5 dB below the fundamental signals, illustrating a third-order intermodulation distortion ratio improvement of 25.5 dB for the attenuator settings and component characteristics assumed in the version shown in FIG. 14.

Figure 17:
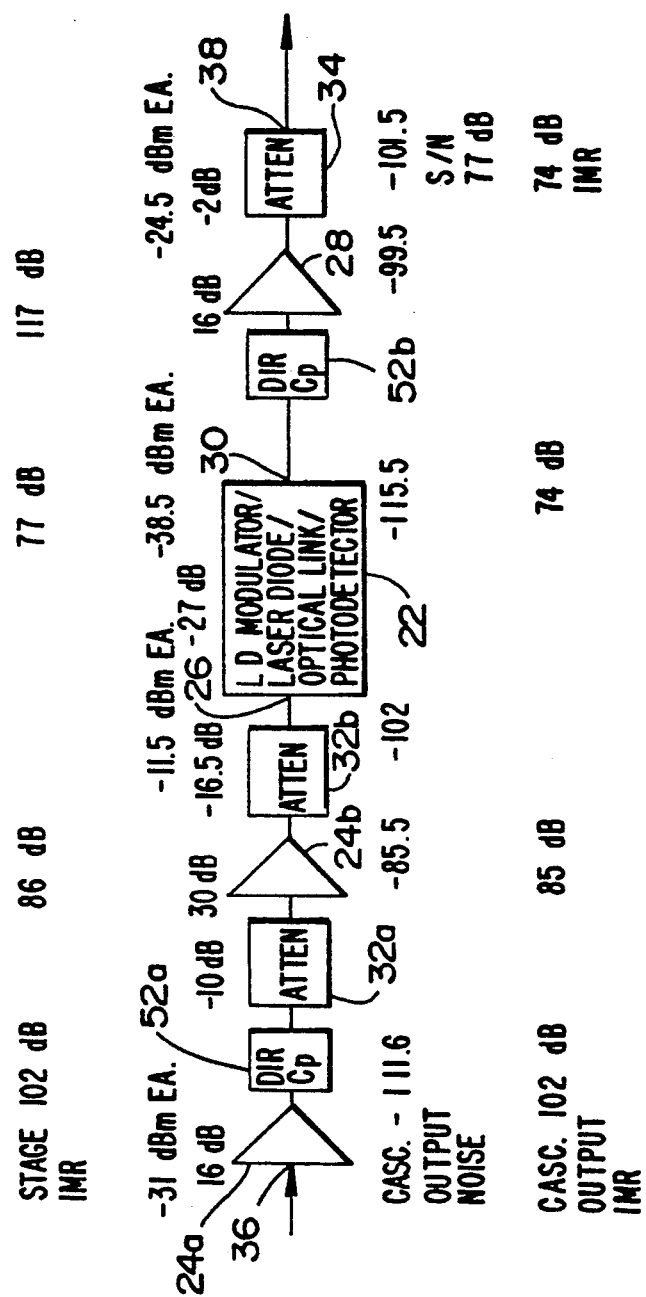
FIG. 17 is a block diagram illustrating the predicted operation of the system illustrated in FIG. 14, with two input signals of −31 dBm each.

A further input level case for the version of the invention which is shown in FIG. 14, is shown in FIG. 17. In this case, two signals at input levels greater than −35 dBm are connected to system input 36. In this case, the invention described herein operates similarly to an AGC amplifier approach, since the overall link gain is reduced to a value below 10 dB at extremely high input levels. For this example, with two system input signals at −31 dBm each, the overall gain is reduced to 6.5 dB. Most significantly, the intermodulation products generated as a result do not increase dramatically with respect to the fundamental signals. For example, with two system input signals at −31 dBm each, as shown in FIG. 17, the two-tone third-order intermodulation products would be 74 dB lower than the fundamental level, and the output signal-to-random noise (S/N) ratio in a 30 kHz bandwidth would be 77 dB.

The present invention described herein thus substantially improves the robustness and signal handling capability of remote antenna units. It is noted that the analysis of FIGS. 15-17 shows that preamplifier 24a and 28 have output third-order intercepts which are 10-15 dB higher than actually required for this application; therefore, lower cost units could likely be employed instead. The particular levels, attenuator settings, and component characteristics contained in this description are only intended to show various embodiments of the invention and to demonstrate its enhanced performance, compared to other devices which are also intended to provide an antenna remoting function. Other levels, settings and characteristics could thus alternately be used.

Figure 7:
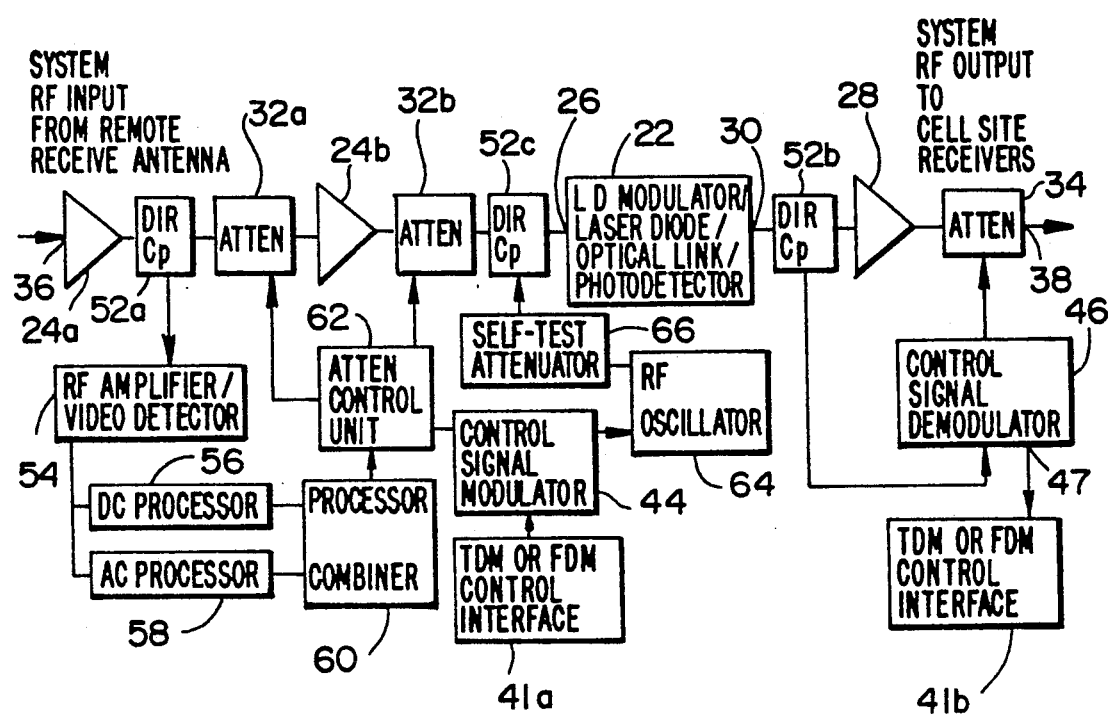
FIG. 7 is a block diagram illustrating a sixth embodiment of the dynamic range enhancing system of the present invention, including a service channel for maintenance purposes, a self-test variable attenuator, a control signal modulator, and a control interface.

A sixth embodiment of the present invention is shown in FIG. 7, and details a more specific structure for transmitting setting values of attenuator 34 over transmission link 22. In other words, this sixth embodiment of the present invention illustrates a system employed to provide control for attenuator 34 and additionally facilitate other maintenance communication, remote control and alarm reporting functions. The output of attenuator control unit 62 may be in either analog or digital form and contains information regarding the desired instantaneous setting for attenuator 34. In this sixth embodiment, all similarly labeled elements are the same as those in the fifth embodiment shown in FIG. 6. The sixth embodiment shown in FIG. 7 also comprises control interfaces 41a and 41b, self test attenuator 66, and RF oscillator 64. The output of attenuator control unit 62 is connected to control signal modulator 44, which may be an FM/FSK (Frequency Modulation/Frequency Shift Keying), PM/PSK (Phase modulation/Phase Shift Keying) or AM/ASK (Amplitude Modulation/Amplitude Shift Keying) control signal modulator, and the output of the control signal modulator 44 is in turn connected to RF oscillator 64. RF oscillator 64 is connected to directional coupler 52c via self-test attenuator 66, which is provided therebetween.

According to this embodiment, control signal modulator 44 may be fed by a TDM (Time Division Multiplexed) or FDM (Frequency Division Multiplexed) control interface 41a, having an output connected thereto. TDM or FDM control interface 41a allows other remote control or alarm reporting functions to be transmitted over transmission link 22, as desired. For example, it is possible to implement a service channel for maintenance purposes by allowing voice or data signals to be transmitted from the cell sites over the link to the remote antenna unit, as discussed below.

The frequency of RF oscillator 64 is selected to match an associated control signal demodulator 46 at the opposite end of transmission link 22. The frequency selected could be slightly outside the normal desired signal frequency band of interest of the transmit signal which is input at system input 36. Another possible implementation of RF oscillator 64 would be to utilize a standard IF (Intermediate) frequency such as 10.7 MHz or 21.4 MHz for the RF oscillator output frequency. Selection of the particular frequency also depends on ensuring that no significant intermodulation products (due to a combination of the control signal with received post-transmission signals) will fall within the frequency band of interest and cause interference with desired signals. The level of the control signal may be rather low with respect to normal received RF signals, depending on the required information detection bandwidth for the desired control speed and the required carrier-to-noise ratio of the control signal demodulator 46. The output of RF oscillator 64 may be, in turn, fed through a variable attenuator if a self-test (i.e., dynamic range test) function is desired, and then, in turn, fed through a second directional coupler 52c into input 26 of transmission link 22.

At the distant (post-transmission) end of transmission link 22, the control signal is picked off either at transmission link output 30 (when a low frequency RF control signal is used) before preamplifier 28 through directional coupler 52b or alternatively after preamplifier 28 through a fourth directional coupler (not shown). The RF control signal intended for attenuator 34 is then connected to control signal demodulator 46, and the control information is further processed by an attenuator processor, which in turn sets the level of attenuation for attenuator 34. An auxiliary output 47 of control signal demodulator 46 may be connected to an optional TDM or FDM interface unit 41b to allow alarm reporting and service channel information to be recovered, which may have been sent by control interface 41a.

For a micro-cell antenna remoting application, no special delay compensation is envisioned to avoid generation of undesirable system output transients. For extremely demanding applications, a fixed time delay element can be utilized in series with the input to attenuator 32a, and another time delay element may be placed in series with the input to attenuator 34, to ensure that delays caused by monitor device 54 and the rest of the control device, along with delays caused by control signal demodulator 46, will provide the desired transient response at system output 38. In the event a high-speed control function is implemented, the AM suppressed by attenuators 32a and 32b will be compensated for and restored to the desired system signal level by attenuator 34.

Figure 8:
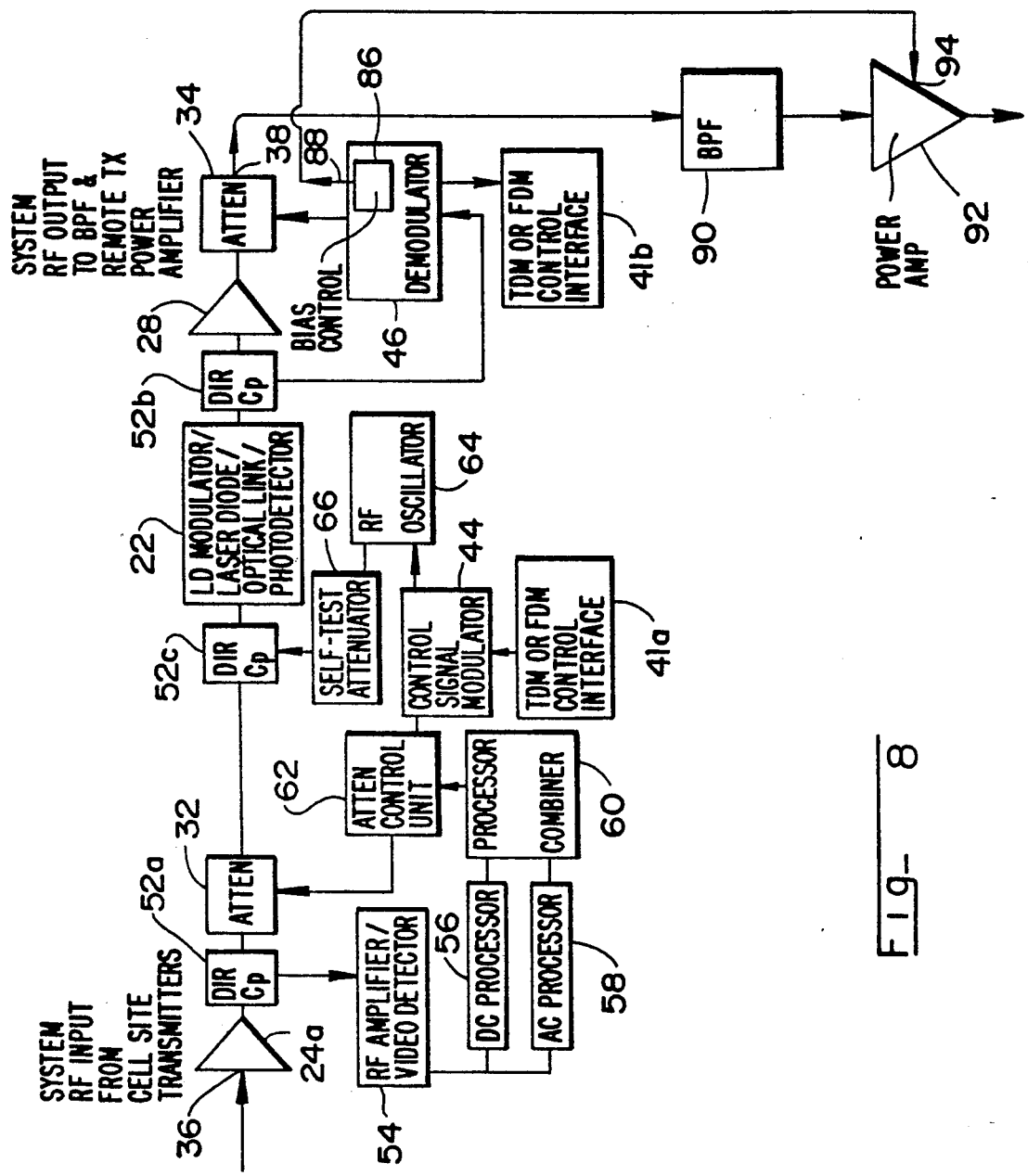
FIG. 8 is a block diagram illustrating a seventh embodiment of the dynamic range enhancing system of the present invention configured to enhance the dynamic range of a remote transmit link in the direction of transmission toward a remote antenna.

The system control and self-test capabilities of the sixth embodiment, as shown in FIG. 7, may also be provided for a remote antenna transmit link, as shown in the seventh embodiment of FIG. 8. Since high level transmit signals are typically available at the cell sites, three stages of amplification would typically not be required, unlike the situation for the remote receiving link, as previously discussed. Therefore, only two variable attenuators 32 and 34 are provided in the seventh embodiment of FIG. 8. The dynamic range enhancing system of the seventh embodiment provides a measure of protection for high-level signals which might overdrive the laser or light-emitting diode of transmission link 22 located at the cell site, which may be utilized for the remote antenna of the unit transmit function. It is noted that, aside from only having a single attenuator 32 at the pre-transmission side of transmission link 22, the structure of the system of the seventh embodiment of FIG. 8 is substantially identical to that of the sixth embodiment in FIG. 7.

Other benefits of employing a feed forward control system for the cell site-to-micro-cell direction include providing system control, self-test, and service channel capability. In the event an out-of-band RF oscillator frequency is used, an RF filter with adequate attenuation must be provided to ensure that the micro-cell antenna will not radiate the RF control signal at a significant level to cause interference to other systems or exceed FCC spurious radiation limits.

Because of the configuration of the invention described herein and the feature which provides for transmission of the optically encoded associated attenuator control signal, along with the processed RF transmit signal, it is possible to utilize more than one optical receiver physical location, providing single-to-multi-point distribution. In this case, each optical receiver location would contain the functions required to process the incoming signal, including a photodetector, a post transmission preamplifier, a post transmission attenuator, and a control signal demodulator.

Referring to FIG. 8, system output 38 is fed to a bandpass filter 90 and remote transmit power amplifier 92. In accordance with an additional embodiment of the invention, the control signal demodulator 46 may optionally be configured to furnish an additional analog or digital output signal via a second output 88 to a bias control port 94 of remote transmit power amplifier 92. More particularly, control signal demodulator 46 may be provided with a bias control unit 86 of one of two types: a first type, which provides an output signal which is proportional to the amount of the system input signal level, or alternatively, a second type, which provides an output signal which indicates whether or not the system RF input signal level is above or below a certain predetermined threshold.

In the first type, bias control unit 86, may simply perform a mathematical operation on the attenuator setting signal, so that the output signal increases the remote transmit power amplifier current and/or voltage by changing the signal at the bias control port in proportion to the level of the system RF input signal. In the second type, bias control unit 86 may simply determine if the magnitude of the attenuator setting signal is above or below a certain predetermined value and accordingly send either a high or low value signal to the bias control port, causing the remote transmit power amplifier current and/or voltage to be set at either a high or a low value.

Such bias-controlled power amplifiers typically maintain a substantially fixed RF gain over the entire bias control range, but the amplifier linearity improves considerably at high values of consumed AC or DC power. Thus, this additional embodiment reduces the power consumption of the power amplifier when the signal level is low, and increases the power consumption of the power amplifier by changing its bias, when the total input signal level increases to provide a higher degree of linearity at an increased DC or AC power consumption.

The advantage of this additional embodiment is that it uses the information already present within control signal demodulator 46, which was based on the measurements made at the opposite end of the transmission link, to reduce the power consumption of the remote transmit power amplifier until such time that a high degree of linearity is actually required. When the signal levels are high, the linearity will be enhanced via bias control port 94, causing an increase in power consumption of remote transmit power amplifier 92. When the system input signal level drops, the power consumption will be reduced.

In accordance with an additional embodiment of the invention, the control signal demodulator 46 may optionally be configured to measure the long-term average level of the incoming control signal and effect the setting of the second signal level changing means to optionally compensate for variations in optical loss which could affect all RF signals transmitted over transmission link 22. For example, in the event the level of the incoming control signal were too low due to excessive optical attenuation or low optical return loss, the output of the second signal level changing device could be increased slightly to compensate for the resulting low RF signal levels. The advantage of this additional embodiment is that it uses the capability already present within control demodulator 46 and adds a simple control signal long-term average level measurement capability at a low additional cost to greatly enhance the overall system performance.

Figure 9:
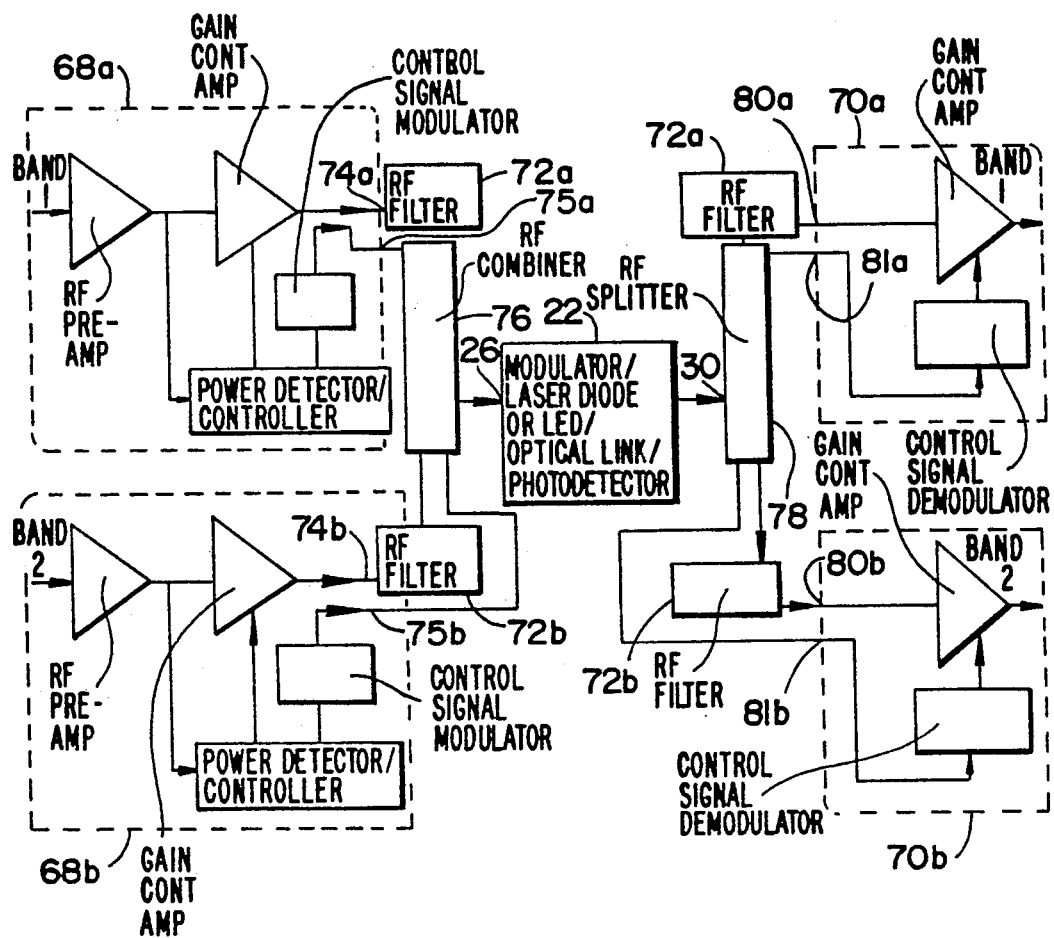
FIG. 9 is a block diagram illustrating an eighth embodiment of the dynamic range enhancing system of the present invention configured so that each frequency band of an input transmit signal is processed by a separate and independently-acting dynamic range enhancer subsystem.
Figure 10:
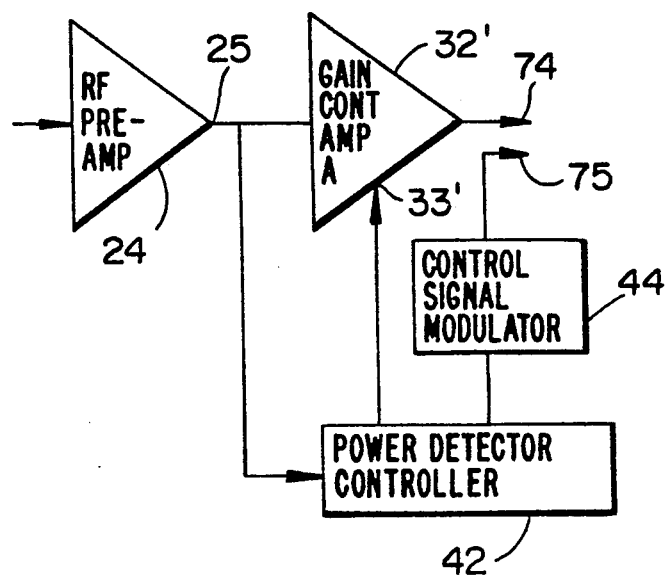
FIG. 10 is a block diagram illustrating the pretransmission processor of the dynamic range enhancing system of the enhancing system of FIG. 9.
Figure 11:
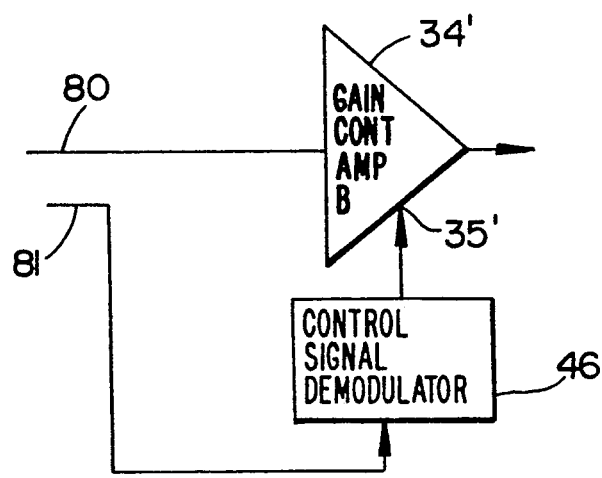
FIG. 11 is a block diagram illustrating the post-transmission processor of the embodiment of FIG. 9.

An eighth embodiment of the present invention is shown in FIGS. 9-11, where two or more dynamic range enhancing subsystems may be simultaneously combined to provide improved dynamic range performance within two or more (i.e., distinct) RF or microwave frequency bands. To facilitate review of the same, only two such enhancers are shown in FIG. 9. FIGS. 10 and 11, respectively, illustrate pre- and post-transmission processors used in the system of FIG. 9.

In this configuration, a plurality (e.g., two) of pre-transmission processors 68a, 68b, and a plurality (e.g., two) of post-transmission processors 70a and 70b are provided. RF transmit signal outputs 74a, 74b of pre-transmission processors 68a, 68b are each connected to a respective RF band-pass filter 72a, 72b. Control signal outputs 75a, 75b of pre-transmission processors 68a, 68b are both input to RF combiner 76. Each of RF filters 72a, 72b have outputs which are also connected to RF combiner 76. RF combiner 76 is connected to input 26 of transmission link 22.

Similarly, RF splitter 78 is connected to output 30 of transmission link 22. Corresponding RF filters 72a, 72b are connected to RF splitter 78, and have outputs which are connected to RF transmit signal inputs 80a, 80b of post-transmission processors 70a and 70b. Further, a plurality of split outputs of RF splitter 78 are connected to respective control signal inputs 81a, 81b of post-transmission processor 70a, 70b.

A key characteristic of RF transmission links which have electro-optic components is their wide RF bandwidth. Since the RF bandwidth of laser diode modulators and photo-diode detectors available today typically exceed 3 GHz, multiple radio frequency bands of interest may be transmitted simultaneously over a single optical link, if the overall dynamic range is adequate.

In this alternative embodiment, two or more pre-transmission processors as shown in FIG. 10, which in previously described embodiments preceded the transmission link, may be combined to form the composite inputs to the transmission link as shown in FIG. 9.

Similarly to the previously described embodiments, and as shown in FIG. 10, a pre-transmission processor comprises a preamplifier 24, gain control amplifier 32', control device 42 and control signal modulator 44. The input of control device 42 is connected to output 25 of preamplifier 24. Further, one output of control device 42 is connected to control input terminal 33' of gain controlled amplifier 32', and a second output of control device 42 is connected to control signal modulator 44 which generates a modulation of the control signal produced by control device 42 to allow transmission over transmission link 22.

At the distant post-transmission end of transmission link 22, an identical quantity of post-transmission processors, such as those shown in FIG. 11, are separately employed, along with suitable filters for each frequency band, in order to obtain desired RF signal levels. In each post-transmission processor, as shown in FIG. 11, a gain control amplifier 34' and control signal demodulator 46 are provided. RF transmit signal input 80 is connected to gain control amplifier 34', and control signal input 81 is connected to an input of control signal demodulator 46, the output of which is connected to control input 35' of gain control amplifier 34'.

The major difference between this embodiment and the previously described embodiments is the use of RF or microwave filters and RF signal combining and splitting networks to provide separate but simultaneous processing capability at both ends of transmission link 22, with each frequency band processed by a separate and independently acting dynamic range enhancer. For example, if one frequency band has extremely high level signals present while another frequency band simultaneously does not, it is desirable to be able to attenuate the high level signals in one frequency band before they reach the laser diode modulator, or light-emitting diode modulator, while providing no attenuation for the low-level signals in the other frequency band.

One control signal modulator may be required for each separate pre-transmission processor, with separate devices for transferring the control signal information to the distant end of the optical link, so that each separate post-transmission processor may be separately controlled, providing enhanced link dynamic range performance.

A separate frequency band system as illustrated in this embodiment (FIG. 9) may be applied to any of the other embodiments disclosed herein to provide these same benefits.

There are many possible ways to provide the capability for transmitting the required multiple analog and/or digital control signals over transmission link 22. Three notable, but non-limiting, examples are:

1) Multiple frequency division multiplexed carriers may be provided, each being separately modulated by the control information, with separate demodulators (one frequency-division multiplexed [FDM] demodulator for each control carrier) at the distant end of the optical link, as shown in FIG. 9.
2) Alternatively, a single RF carrier with separate control channel subcarriers (onto which the control information for each separate frequency band is modulated) may be provided, with a single RF demodulator at the distant end of the optical link, and with separate subcarrier demodulators for each control signal.
3) Alternatively, a single RF carrier (onto which the control information for each separate frequency band is time division multiplexed) may be provided, with a single RF demodulator at the distant end of the optical link, along with a time division demultiplexer to provide the required control signals at the distant end (TDM).

Because the time delays associated with processing the control signals for all frequency bands may not be equal, separate devices, for providing the proper time delay equalization, may be provided with each pre-optical processor and post-optical processor in order to obtain the desired transient response for each frequency band. Such devices include time delay networks described in a previous embodiment to the present invention.

Figure 12:
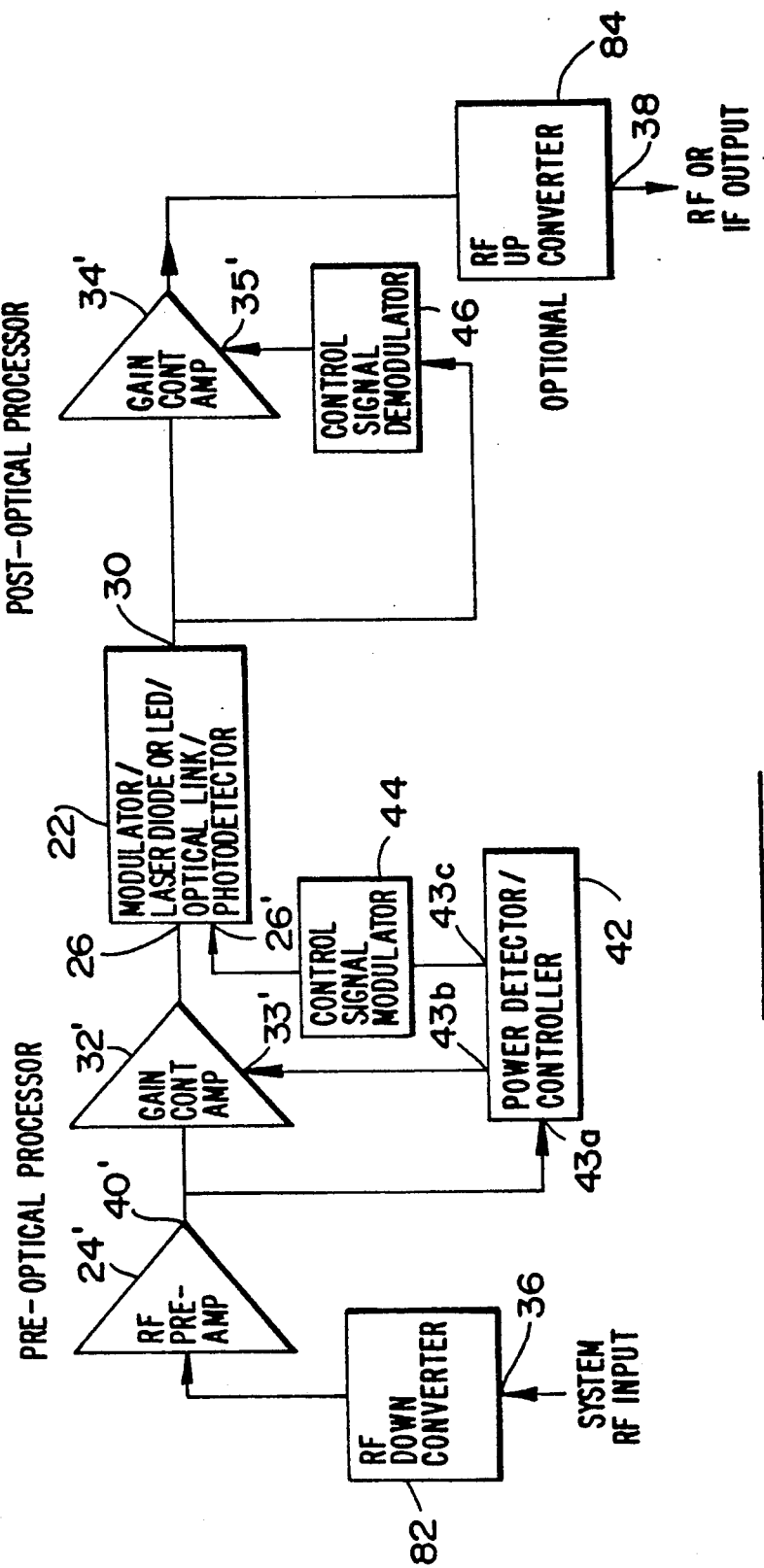
FIG. 12 is a block diagram illustrating a ninth embodiment of the dynamic range enhancing system of the present invention, wherein a downward frequency converter is employed at the pre-transmission remote antenna side of the transmission link to convert the RF transmit signal to a lower frequency before transmission over the transmission link, and an optional up-converter is employed at the distant post-transmission side of the transmission link.

A ninth embodiment will now be described with reference to FIG. 12. In this embodiment, similarly to the second embodiment shown in FIG. 3, preamplifier 24', gain control amplifier 32', transmission link 22, gain control amplifier 34', control device 42, control signal modulator 44, and control signal demodulator 46 are provided. However, in addition, an RF downward frequency converter 82 and an RF upward frequency converter 84 are also provided. RF downward frequency converter (hereinafter RF down converter) 82 is connected to the input of preamplifier 24', and RF upward frequency converter (hereinafter referred to as RF up converter) 84 is connected to the output of gain control amplifier 34'.

In this embodiment, down-converter 82 is employed at the remote antenna pre-transmission end of transmission link 22 to convert RF signals to a lower frequency before transmission over transmission link 22, and an optional up-converter 84 is employed at the post-transmission end of transmission link 22. The actual position of the frequency converter subsystems 82, 84 with respect to the previously described elements of the invention depends upon the specific application for the system. For example, the down-converter 82 might precede pre-transmission processing by preamplifier 24' and gain control amplifier 32', and optional up-converter 84 at the post-transmission end of transmission link 22 might be connected following the post-optical processing by gain control amplifier 34'.

The advantage of utilizing such additional frequency converters for transmission systems having laser diodes may be understood due to the frequency-independent non-linearity of laser diodes at high modulation levels, and the frequency-dependent linearity of laser diodes at lower modulation levels.

Based upon published results, at lower level modulation levels where the non-linearity is dominated by AM/PM, laser diode linearity may be improved by as much as 40 dB/decade frequency by utilizing lower RF frequencies for the optical link. For such applications, it is expected that a substantial performance improvement may be obtained. At higher modulation levels, where the laser diode non-linearity is dominated by AM/AM, only a small performance benefit is expected by using one or more frequency converters, as shown in this embodiment.

For transmission links including light-emitting diodes (optical LED systems), the frequency response and cost of the system are typically less than for laser diode systems, and therefore, cost benefit may be obtained for some LED system applications where the one or more frequency converters in the previously described invention are combined, as in this ninth embodiment of the present invention.

For all types of remote RF systems, related cost and performance should be considered since the additional non-linearity, phase noise and cost of one or more frequency converters must be taken into account. For some applications, use of this alternative embodiment may therefore not be desirable.

Due to the use of a second level changing device, the present invention has a lower output random noise level at low system input levels compared with conventional approaches, allowing easier combining of transmission link outputs for networks used for simulcast applications and networks utilizing a star architecture (for example, compared with prior art devices employing AGC amplifiers prior to input to an optical modulator). Diversity Antenna applications may improve reliability and quality of communications, where space, polarization, and angle diversity antennas are employed, and processed outputs of two or more remote antennas may be combined either coherently or non-coherently (using various means known to those skilled in the art). This allows a single optical fiber cable link to be employed for transmitting and receiving signals from more than one antenna to the cell site to improve reliability and quality of communications over the desired coverage area.

A conventional device using an AGC or limiting amplifier prior to the optical modulator could potentially cause more frequent transmit power changes at the portable terminal than if a fixed gain approach were used, since it essentially adds to the amount of variation in signal level caused by the RF propagation environment, increasing demand on the network switch and links connecting the cell sites. If a high level signal from a nearby user terminal causes a reduced system output level for a desired lower-level signal, ultimately causing the system to request a distant terminal to increase its transmit power beyond that normally required to maintain communication, the result would be increased intra-system (inter-cell) interference. In situations where multiple outputs of optical links are non-coherently combined (and some outputs are increasing due to higher terminal transmit power while others are not) an excessive number of system transmit power change commands and interference would be generated than would otherwise be the case.

The invention's higher usable input range allows cellular and microcellular systems to be deployed which do not employ reverse channel transmit power control and instead use portable and mobile terminals with fixed transmit power. Such systems may be more cost-effective than systems employing power control for many applications. The system of the present invention may also be implemented in conjunction with a booster or cell enhancer system.

While the invention has been described by way of its preferred embodiments, it is understood that the words which have been used herein are words of description, rather than words of limitation. Changes may be made, within the purview of the appended claims, without departing from the scope and spirit of the invention in its broader aspects. Although the invention has been described herein with reference to particular means, materials and embodiments, it is understood that the invention is not limited to the particulars disclosed herein, and that the invention extends to all equivalent structures, methods and uses which are within the scope of the appended claims. For example, any of the signal level changing devices describe herein in conjunction with each of the various embodiments may be implemented with either a variable attenuator or a variable gain amplifier, or any combination including one or both. Additionally, any of the control signals and output signals of the various disclosed system elements may be implemented in either analog or digital form; and the dynamic range enhancing system may be implemented without a preamplifier (e.g., preamplifier 24) present at its system input, or alternatively without a preamplifier (e.g., preamplifier 28) present at the input to the second level changing device.

What is claimed is:

1. A system for controlling the amount of noise introduced into a transmit signal adapted to be transmitted over a transmission link within a communication path, the transmission link extending from a first location to a second location remote from the first location, said system comprising:
    control means for detecting, at an initial position along the communication path, the level of the transmit signal, and for controlling first signal level changing means and second signal level changing means in response to the detected level;
    said first signal level changing means comprising means for changing the level of said transmit signal before transmission over said link, and said second signal level changing means comprising means for changing the level of said transmit signal after transmission over said link, said control means controlling said first and second signal level changing means to change the level of said transmit signal in a coordinated fashion based on the detected level;
    said first and second signal level changing means respectively comprising first and second outputs and means for changing the level of the transmit signal present at said first and second outputs; and
    said control means comprising means for controlling said first and second signal level changing means so that;
        the transmit signal level is decreased at the first output and increased at the second output when the detected transmit signal level increases, and
        the transmit signal level is increased at the first output and decreased at the second output when the detected transmit signal level decreases.

2. The system of claim 1, wherein said control means comprise means for producing first and second control signals to respectively control said first and second signal level changing means.

3. The system of claim 2, wherein said control means further comprise means for transmitting information containing said second control signal over said transmission link.

4. The system of claim 2, wherein said system further comprises a modulator for modulating said second control signal to produce a modulated version of said second control signal and a demodulator for demodulating said modulated version of said second control signal to produce a demodulated version of said second control signal.

5. The system of claim 2, wherein said system further comprises means for measuring the level of said second control signal and affecting the control of said second signal level changing means.

6. The system of claim 2, wherein said second control signal which is transmitted over said transmission link comprises an FM/FSK control signal modulator.

7. The system of claim 1, wherein said first signal level changing means are positioned at an input location of said transmission link, and wherein said second level changing means are positioned at an output location of said transmission link.

8. The system of claim 1, wherein said first signal level changing means comprise a gain controlled amplifier.

9. The system of claim 1, wherein said second signal level changing means comprise a gain controlled amplifier.

10. The system of claim 1, wherein one end of said transmission link is coupled to one or more of radio channel transceivers and receivers and a second end of said transmission link is coupled to a remote antenna.

11. The system of claim 1, wherein said control means is connected directly to said first signal level changing means and is connected indirectly to said second signal level changing means via said transmission link.

12. The system of claim 1, wherein said first and second signal level changing means are controlled so that a change in the transmit signal level at the first output is equal to a change in the transmit signal level at the second output.

13. The system of claim 12, wherein said first and second signal level changing means are controlled so that a change in the transmit signal level at either of the first or second outputs is equal to the amount by which there is a change in the detected transmit signal level.

14. The system of claim 1, wherein said first and second signal level changing means each comprise an adjustable linear multiplier for multiplying the transmitted signal level by a desired instantaneous multiplicand value.

15. The system of claim 1, wherein said control means detects the level of the transmit signal before the transmit signal reaches said first signal level changing means.

16. A system for controlling the amount of noise introduced into a transmit signal adapted to be transmitted over a transmission link within a communication path, the transmission link extending from a first location to a second location remote from the first location, said system comprising:
    control means for detecting, at an initial position along the communication path, the level of the transmit signal, and for controlling first signal level changing means and second signal level changing means in response to the detected level;
    said first signal level changing means comprising means for changing the level of said transmit signal before transmission over said link, and said second signal level changing means comprising means for changing the level of said transmit signal after transmission over said link, said control means controlling said first and second signal level changing means to change the level of said transmit signal in a coordinated fashion based on the detected level;

said first and second signal level changing means respectively comprising first and second outputs and means for changing the level of the transmit signal present at said first and second outputs; and said first and second signal level changing means each comprising means for changing the level of the transmit signal, at said first and second outputs, within defined signal level changing ranges and respective means for setting said first and second signal level changing means to be at an end of said defined signal level changing ranges, whereby each of said first and second signal level changing means increases or decreases the level of the transmit signal at respective first and second outputs by a maximum change in value when set at an end of said defined signal level changing range.

17. The system of claim 1, wherein said control means comprises means for controlling said first signal level changing means and said second signal level changing means to be set at respective ends of said defined signal level changing ranges, when said detected level of said transmit signal is below a first threshold.

18. The system of claim 17, wherein said control means comprises means for controlling, when said detected level of said transmit signal is below said first threshold, said first signal level changing means to be at the most increased end of said defined signal level changing range, whereby the signal level present at said first output is at a maximum possible value.

19. The system of claim 18, wherein said control means comprises means for controlling, when said detected level of said transmit signal is below said first threshold, said second signal level changing means to be at the most decreased end of said defined signal level changing range, whereby the signal level present at said second output is at a minimum possible value.

20. The system of claim 16, wherein said control means comprises means for controlling said first signal level changing means to decrease the level of the transmit signal present at said first output by an amount approximately equal to the amount by which said detected level exceeds a first threshold value, when said detected level is above said first threshold value.

21. The system of claim 20, wherein said control means comprises means for concurrently controlling said second signal level changing means to increase the level of the transmit signal present at said second output by an amount approximately equal to the amount by which said detected level exceeds said first threshold value, when said detected level is above said first threshold value.

22. The system of claim 20, wherein said control means comprise means for controlling said second signal level changing means to be at the most increased end of said defined signal level changing range, whereby the signal level present at its output is at a maximum possible value, when said detected level of said transmit signal is above a second threshold which is greater than said first threshold.

23. The system of claim 21, wherein said transmission link comprises an optical link.

24. The system of claim 23, wherein said system further comprises time delay means to compensate for time delays caused by said control means.

25. The system of claim 23, wherein said system further comprises service channel transmission means for conducting maintenance communication across said transmission link.

26. The system of claim 23, wherein said control means further comprises a time division multiplexed (TDM) or frequency division multiplexed (FDM) control interface.

27. The system of claim 23, wherein said control means comprises a plurality of controllers, said first signal level changing means comprises a first set of signal level modifiers, and said second signal level changing means comprises a second set of signal level modifiers, and further wherein each of said controllers and modifiers is adapted to separately and independently provide transmission link performance enhancement for respective separate frequency bands of said transmit signal.

28. The system of claim 27, wherein said first and second sets of signal level modifiers are identical in number.

29. The system of claim 27, wherein said system comprises a respective filter for each of said separate frequency bands of said transmit signal, and further wherein the system comprises a combining network connected to the input of said transmission link and a splitting network connected to the output of said transmission link.

30. A system for controlling the amount of noise introduced into a transmit signal adapted to be transmitted over a transmission link within a communication path, the transmission link extending from a first location to a second location remote from the first location, said system comprising:

control means for detecting, at an initial position along the communication path, the level of the transmit signal, and for controlling first signal level changing means and second signal level changing means in response to the detected level;

said first signal level changing means comprising means for changing the level of said transmit signal before transmission over said link, and said second signal level changing means comprising means for changing the level of said transmit signal after transmission over said link, said control means controlling said first and second signal level changing means to change the level of said transmit signal in a coordinated fashion based on the detected level;

said control means comprising means for producing first and second control signals to respectively control said first and second signal level changing means;

said system further comprising a modulator for modulating said second control signal to produce a modulated version of said second control signal and a demodulator for demodulating said modulated version of said second control signal to produce a demodulated version of said second control signal, said demodulator further comprising bias control means for performing an operation on said demodulated version of said second control signal and, based on said operation, outputting a bias control signal which is proportional to said detected level of said transmit signal.

31. The system of claim 30, wherein said system further comprises a power amplifier connected to an output of said second signal level changing means, said power amplifier comprising a bias control port, and further wherein said bias control means further comprises means for connecting said bias control signal to said bias control port.

32. A system for controlling the amount of noise introduced into a transmit signal adapted to be transmitted over a transmission link within a communication path, the transmission link extending from a first location to a second location remote from the first location, said system comprising:

control means for detecting, at an initial position along the communication path, the level of the transmit signal, and for controlling first signal level changing means and second signal level changing means in response to the detected level;

said first signal level changing means comprising means for changing the level of said transmit signal before transmission over said link, and said second signal level changing means comprising means for changing the level of said transmit signal after transmission over said link, said control means controlling said first and second signal level changing means to change the level of said transmit signal in a coordinated fashion based on the detected level;

said control means comprising means for producing first and second control signals to respectively control said first and second signal level changing means;

said system further comprising a modulator for modulating said second control signal to produce a modulated version of said second control signal and a demodulator for demodulating said modulated version of said second control signal to produce a demodulated version of said second control signal, said demodulator further comprising bias control means for determining if said demodulated version of said second control signal is below or above a predetermined threshold value.

33. The system of claim 32, wherein said bias control means comprises means for outputting a signal having a first value when said demodulated version of said second control signal is below said predetermined threshold value and having a second value when said demodulated version of said second control signal is above said predetermined threshold value.

34. The system of claim 33, wherein said system further comprises a power amplifier connected to an output of said second signal level changing means, said power amplifier comprising a bias control port, and further wherein said bias control means further comprises means for connecting said bias control signal to said bias control port.

35. A system for controlling the amount of noise introduced into a transmit signal adapted to be transmitted over a transmission link within a communication path, the transmission link extending from a first location to a second location remote from the first location, said system comprising:

control means for detecting, at an initial position along the communication path, the level of the transmit signal, and for controlling first signal level changing means and second signal level changing means in response to the detected level;

said first signal level changing means comprising means for changing the level of said transmit signal before transmission over said link, and said second signal level changing means comprising means for changing the level of said transmit signal after transmission over said link, said control means controlling said first and second signal level changing means to change the level of said transmit signal in a coordinated fashion based on the detected level;

said control means comprising means for producing first and second control signals to respectively control said first and second signal level changing means; said control means further comprising means, including a variable attenuator, for remotely verifying the proper operation of the system and determining the dynamic range of the system.

36. A system for controlling the amount of noise introduced into a transmit signal adapted to be transmitted over a transmission link within a communication path, the transmission link extending from a first location to a second location remote from the first location, said system comprising:

control means for detecting, at an initial position along the communication path, the level of the transmit signal, and for controlling first signal level changing means and second signal level changing means in response to the detected level;

said first signal level changing means comprising means for changing the level of said transmit signal before transmission over said link, and said second signal level changing means comprising means for changing the level of said transmit signal after transmission over said link, said control means controlling said first and second signal level changing means to change the level of said transmit signal in a coordinated fashion based on the detected level;

said control means comprising means for producing first and second control signals to respectively control said first and second signal level changing means; said second control signal which is transmitted over said transmission link comprising a PM/PSK modulated control signal.

37. A system for controlling the amount of noise introduced into a transmit signal adapted to be transmitted over a transmission link within a communication path, the transmission link extending from a first location to a second location remote from the first location, said system comprising:

control means for detecting, at an initial position along the communication path, the level of the transmit signal, and for controlling first signal level changing means and second signal level changing means in response to the detected level;

said first signal level changing means comprising means for changing the level of said transmit signal before transmission over said link, and said second signal level changing means comprising means for changing the level of said transmit signal after transmission over said link, said control means controlling said first and second signal level changing means to change the level of said transmit signal in a coordinated fashion based on the detected level;

said control means comprising means for producing first and second control signals to respectively control said first and second signal level changing means, said second control signal which is transmitted over said transmission link comprising an AM/ASK modulated control signal.

38. A system for controlling the amount of noise introduced into a transmit signal adapted to be transmitted over a transmission link within a communication path, the transmission link extending from a first location to a second location remote from the first location, said system comprising:

control means for detecting, at an initial position along the communication path, the level of the transmit signal, and for controlling first signal level changing means and second signal level changing means in response to the detected level;

said first signal level changing means comprising means for changing the level of said transmit signal before transmission over said link, and said second signal level changing means comprising means for changing the level of said transmit signal after transmission over said link, said control means controlling said first and second signal level changing means to change the level of said transmit signal in a coordinated fashion based on the detected level, said transmit signal being an RF signal and comprising a variable number of input signals.

39. A system for controlling the amount of noise introduced into a transmit signal adapted to be transmitted over a transmission link within a communication path, the transmission link extending from a first location to a second location remote from the first location, said system comprising:

control means for detecting, at an initial position along the communication path, the level of the transmit signal, and for controlling first signal level changing means and second signal level changing means in response to the detected level;

said first signal level changing means comprising means for changing the level of said transmit signal before transmission over said link, and said second signal level changing means comprising means for changing the level of said transmit signal after transmission over said link, said control means controlling said first and second signal level changing means to change the level of said transmit signal in a coordinated fashion based on the detected level;

said control means comprising means for controlling said first and second signal level changing means in order to enhance a usable RF input signal level range of the transmission link.

40. A system for controlling the amount of noise introduced into a transmit signal adapted to be transmitted over a transmission link within a communication path, the transmission link extending from a first location to a second location remote from the first location, said system comprising:

control means for detecting, at an initial position along the communication path, the level of the transmit signal, and for controlling first signal level changing means and second signal level changing means in response to the detected level;

said first signal level changing means comprising means for changing the level of said transmit signal before transmission over said link, and said second signal level changing means comprising means for changing the level of said transmit signal after transmission over said link, said control means controlling said first and second signal level changing means to change the level of said transmit signal in a coordinated fashion based on the detected level; and said control means comprising means for measuring the instantaneous composite power level of said transmit signal before transmission over said transmission link.

41. The system of claim 40, wherein said control means comprise means for monitoring the power level of said transmit signal before pre-transmission processing by said first signal level changing means.

42. A system for controlling the amount of noise introduced into a transmit signal adapted to be transmitted over a transmission link within a communication path, the transmission link extending from a first location to a second location remote from the first location, said system comprising:

control means for detecting, at an initial position along the communication path, the level of the transmit signal, and for controlling first signal level changing means and second signal level changing means in response to the detected level;

said first signal level changing means comprising means for changing the level of said transmit signal before transmission over said link, and said second signal level changing means comprising means for changing the level of said transmit signal after transmission over said link, said control means controlling said first and second signal level changing means to change the level of said transmit signal in a coordinated fashion based on the detected level, said control means comprising means for measuring the total average RF signal level of said transmit signal before transmission over said transmission link.

43. A system for controlling the amount of noise introduced into a transmit signal adapted to be transmitted over a transmission link within a communication path, the transmission link extending from a first location to a second location remote from the first location, said system comprising:

control means for detecting, at an initial position along the communication path, the level of the transmit signal, and for controlling first signal level changing means and second signal level changing means in response to the detected level;

said first signal level changing means comprising means for changing the level of said transmit signal before transmission over said link, and said second signal level changing means comprising means for changing the level of said transmit signal after transmission over said link, said control means controlling said first and second signal level changing means to change the level of said transmit signal in a coordinated fashion based on the detected level, said control means comprising means for approximating the number of high level signals present in said transmit signal and measuring the resulting second-order intermodulating products.

44. A system for controlling the amount of noise introduced into a transmit signal adapted to be transmitted over a transmission link within a communication path, the transmission link extending from a first location to a second location remote from the first location, said system comprising:

control means for detecting, at an initial position along the communication path, the level of the transmit signal, and for controlling first signal level changing means and second signal level changing means in response to the detected level;

said first signal level changing means comprising means for changing the level of said transmit signal before transmission over said link, and said second signal level changing means comprising means for changing the level of said transmit signal after transmission over said link, said control means controlling said first and second signal level changing means to change the level of said transmit signal in a coordinated fashion based on the detected level, said first signal level changing means comprising a variable attenuator.

45. A system for controlling the amount of noise introduced into a transmit signal adapted to be transmitted over a transmission link within a communication path, the transmission link extending from a first location to a second location remote from the first location, said system comprising:

control means for detecting, at an initial position along the communication path, the level of the transmit signal, and for controlling first signal level changing means and second signal level changing means in response to the detected level;

said first signal level changing means comprising means for changing the level of said transmit signal before transmission over said link, and said second signal level changing means comprising means for changing the level of said transmit signal after transmission over said link, said control means controlling said first and second signal level changing means to change the level of said transmit signal in a coordinated fashion based on the detected level; said second signal level changing means comprising a variable attenuator.

46. A system for controlling the amount of noise introduced into a transmit signal adapted to be transmitted over a transmission link within a communication path, the transmission link extending from a first location to a second location remote from the first location, said system comprising:

control means for detecting, at an initial position along the communication path, the level of the transmit signal, and for controlling first signal level changing means and second signal level changing means in response to the detected level;

said first signal level changing means comprising means for changing the level of said transmit signal before transmission over said link, and said second signal level changing means comprising means for changing the level of said transmit signal after transmission over said link, said control means controlling said first and second signal level changing means to change the level of said transmit signal in a coordinated fashion based on the detected level;

said system further comprising a tandem combination of at least one amplifier and at least one attenuator coupled to a first input location of said transmission link, said tandem combination comprising said first signal level changing means.

47. The system of claim 46, wherein said tandem combination comprises a first preamplifier, a first attenuator, a second pre-amplifier, and a second attenuator, connected in cascade.

48. The system of claim 47, wherein said control means comprises a directional coupler, monitor means, a DC processor, an AC processor, combining means for processing and combining signals output by said DC processor and said AC processor, and attenuator control means for controlling attenuation values of at least one of the attenuators in said system, wherein:

said directional coupler is connected to an output of said first preamplifier, and is adapted to feed an amplified sample of said transmit signal to said monitor means;

said monitor means is adapted to receive said amplifier sample and provides a rectified version of said amplified sample in the form of a video signal, having a bandwidth typically greater than 1 MHz;

said DC processor comprises means for providing a DC measurement signal of said video signal, wherein said DC measurement signal is proportional to the instantaneous composite RF level at the output of said first preamplifier; and said AC processor comprises means for providing an AC measurement signal based on an AC analysis of said video signal, wherein said AC measurement signal is indicative of the instantaneous second order intermodulation products generated by said monitor means.

49. A system for controlling the amount of noise introduced into a transmit signal adapted to be transmitted over a transmission link within a communication path, the transmission link extending from a first location to a second location remote from the first location, said system comprising:

control means for detecting, at an initial position along the communication path, the level of the transmit signal, and for controlling first signal level changing means and second signal level changing means in response to the detected level;

said first signal level changing means comprising means for changing the level of said transmit signal before transmission over said link, and said second signal level changing means comprising means for changing the level of said transmit signal after transmission over said link, said control means controlling said first and second signal level changing means to change the level of said transmit signal in a coordinated fashion based on the detected level;

said system further comprising a downward frequency converter for converting said transmit signal to a lower frequency before transmission over said link.

50. The system of claim 49, wherein said system further comprises an upward frequency converter for converting said transmit signal to a higher frequency after transmission over said link.

51. The system of claim 49, wherein said downward frequency converter comprises means for acting on said transmit signal before processing by said first signal level changing means.

52. The system of claim 49, wherein said transmit signal is transmitted over said transmission link from a side of said transmission link which is connected to a remote antenna.

53. The system of claim 50, wherein said transmit signal is transmitted over said transmission link to a side of said transmission link which is connected to a remote antenna.

54. The system of claim 49, wherein said downward frequency converter comprises means for acting on said transmit signal before processing by said first signal level changing means, and said upward frequency converter comprises means for acting on said transmit signal after processing by said second signal level changing means.

55. A system for controlling the amount of noise introduced into a transmit signal adapted to be transmitted over a transmission link within a communication path, the transmission link extending from a first location to a second location remote from the first location, said system comprising:
   control means for detecting, at an initial position along the communication path, the level of the transmit signal, and for controlling first signal level changing means and second signal level changing means in response to the detected level;
   said first signal level changing means comprising means for changing the level of said transmit signal before transmission over said link, and said second signal level changing means comprising means for changing the level of said transmit signal after transmission over said link, said control means controlling said first and second signal level changing means to change the level of said transmit signal in a coordinated fashion based on the detected level; and
   said control means being connected directly to said first and second signal level changing means.

56. A process for increasing the dynamic range of a transmission link extending from a first location to a second location remote from the first location, said process comprising:
   detecting the level of a transmit signal adapted to be transmitted over said transmission link;
   based on said detected level of said transmit signal and within parameters set forth by a set of control instructions, modifying said transmit signal at the first and second locations;
   creating a table of values having a plurality of signal level codes representing the detected level of said transmit signal, said table also having a plurality of signal level modification codes, respectively corresponding to said signal level codes; and
   defining said set of control instructions to set forth certain parameters, said set of control instructions being established as a function of said detected level of said transmit signal.

57. The process according to claim 56, further comprising:
   approximating the number of high level input signals that are in said transmit signal, and determining whether said approximated number of signals are within a first range of values or a second range;
   separately modifying said transmit signal at the first and second locations according to a first configuration when said approximated number of signals are within said first range; and
   separately modifying said transmit signal at the first and second locations according to a second configuration when said approximated number of signals are within said second range.

58. The process according to claim 57, wherein said first location is adjacent to an input of said transmission link and said second location is adjacent to an output of said transmission link.

59. A process for increasing the dynamic range of a transmission link extending from a first location to a second location remote from the first location, said process comprising:
   monitoring, at an initial position along said transmission link, the level of a transmit signal which is adapted to be transmitted over said transmission link, and based upon said monitored level, independently controlling the level of said transmit signal at a first location before the transmission link and at a second location after the transmission link; and
   decreasing the level of the transmit signal at said first location by an amount approximately equal to the amount by which said monitored level exceeds a threshold value, when said monitored level is above said threshold vale.

60. The process of claim 59, wherein said process, during controlling, carries out a pre-transmission processing of said transmit signal at said first location, and caries out a post-transmission processing of said transmit signal at said second location.

61. The process of claim 59, wherein independently controlling said level includes transmitting information over said transmission link to control the level of said transmit signal at said second location.

62. The process of claim 59, further comprising concurrently increasing the level of the transmit signal at said second location by an amount approximately equal to the amount by which said monitored level exceeds said threshold value, when said detected level is above said threshold value.

* * * * *

UNITED STATES PATENT AND TRADEMARK OFFICE
CERTIFICATE OF CORRECTION

PATENT NO. : 5,321,849

DATED : June 14, 1994

INVENTOR(S) : P. Lemson

It is certified that error appears in the above-indentified patent and that said Letters Patent is hereby corrected as shown below:

Title page, item [54], line 4 under "Title", change "VALVE" to --VALUE--.
        item [56], line 5 under "Other Publications, change "MTT-s" to MTT-S--.
        item [56], line 7 under "Other Publications, change "Hadrware" to --Hardware--.
        line 13 under "Other Publications, change "VIC" to--VTC--.

Title page, item [56], page 2, line 6 under "Other Publications" change "MTT-s" to --MTT-S--.
        item [56], page 2, line 9 under "Other Publications" change "Antenns" to--Antennas--.
        item [56], page 2, line 32 under "Other Publications" change "Race" to -- RACE--.

item [56], page 2, line 35 under "Other Publications" change "general" to--General--.

item [56], page 2, line 42 under "Other Publications" change "New-" to -- Net- --.

item [56], line 43 under " Other Publications" change "tork," Electrontics: to --work, "Electronics--.

item [56], page 2, line 71 under "Other Publications" change "Gremlund et al., Handoff Strategies in Microcellular System," to -- Grimlund et al., Handoff Strategies in Microcellular System,"--.

UNITED STATES PATENT AND TRADEMARK OFFICE
CERTIFICATE OF CORRECTION

PATENT NO. : 5,321,849
DATED : June 14, 1994
INVENTOR(S) : P. Lemson

It is certified that error appears in the above-indentified patent and that said Letters Patent is hereby corrected as shown below:

On the cover section [56], page 2, line 71 under "Other Publications", change "Gremlund et al., Handoff Strategies in Microcellular System," to ---Grimlund et al., "Handoff Strategies in Microcellular System,"---.

At column 1, line 3, change "VALVE" to ---VALUE---.
At column 3, line 68, change "Micro-wave" to ---Microwave---.
At column 17, line 58, change "olds" to ---old---.
At column 22, line 8, change "band width" to ---bandwidth---.
At column 29, line 29, change "weighing" to ---weighting---.
At column 29, line 32, change "weighing" to ---weighting---.
At column 29, line 64, change "form" to ---from---.
At column 30, line 1, change "to" to ---of---.
At column 30, line 39, change "components," to ---components.---.
At column 31, line 43, change "$SD_{IDC}$" TO ---$S_{IDC}$---.
At column 31, line 46, change "$SD_{IDC}$" to ---$S_{IDC}$---.
At column 43, line 23 (claim 17, line 1), change "claim 1" to ---claim 16---.

UNITED STATES PATENT AND TRADEMARK OFFICE
CERTIFICATE OF CORRECTION

PATENT NO. : 5,321,849
DATED : June 14, 1994
INVENTOR(S) : P. LEMSON

It is certified that error appears in the above-indentified patent and that said Letters Patent is hereby corrected as shown below:

At column 48, line 60 (claim 43, line 24), change "intermodulating" to ---intermodulation---.
At column 52, line 32 (claim 59, line 16), change "vale" to ---value---.
At column 52, line 36 (claim 60, line 4), change "caries" to ---carries---.

Signed and Sealed this

Eleventh Day of February, 1997

Attest:

BRUCE LEHMAN

Attesting Officer        Commissioner of Patents and Trademarks